United States Patent
Son et al.

(10) Patent No.: US 10,707,559 B2
(45) Date of Patent: Jul. 7, 2020

(54) ELECTRONIC DEVICE INCLUDING ANTENNA

(71) Applicant: Samsung Electronics Co., Ltd., Gyeonggi-do (KR)

(72) Inventors: Moon Soo Son, Gyeongsangbuk-do (KR); Dong Ryul Shin, Daegu (KR); Hee Jun Lee, Gyeonggi-do (KR); Byung Chan Jang, Gyeongsangbuk-do (KR); Hyun Jun Jeong, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 314 days.

(21) Appl. No.: 15/899,674

(22) Filed: Feb. 20, 2018

(65) Prior Publication Data

US 2018/0248251 A1   Aug. 30, 2018

(30) Foreign Application Priority Data

Feb. 24, 2017   (KR) .................. 10-2017-0024568

(51) Int. Cl.
*H01Q 1/24*   (2006.01)
*H01Q 9/04*   (2006.01)
(Continued)

(52) U.S. Cl.
CPC .............. *H01Q 1/243* (2013.01); *H01Q 1/48* (2013.01); *H01Q 5/328* (2015.01); *H01Q 5/371* (2015.01);
(Continued)

(58) Field of Classification Search
CPC .......... H01Q 5/30; H01Q 5/307; H01Q 5/314; H01Q 5/321; H01Q 5/328; H01Q 5/335; H01Q 5/342; H01Q 5/35; H01Q 5/357; H01Q 5/364; H01Q 5/371; H01Q 5/378; H01Q 5/385; H01Q 5/392; H01Q 1/243
See application file for complete search history.

(56) References Cited

U.S. PATENT DOCUMENTS

| | | | |
|---|---|---|---|
| 7,688,273 | B2 | 3/2010 | Montgomery et al. |
| 8,164,538 | B2 | 4/2012 | Montgomery et al. |

(Continued)

FOREIGN PATENT DOCUMENTS

| | | |
|---|---|---|
| KR | 10-2010-0017207 A | 2/2010 |
| KR | 10-2011-0068114 A | 6/2011 |
| KR | 10-2016-0108809 A | 9/2016 |
| KR | 10-2017-0013682 A | 2/2017 |

*Primary Examiner* — Daniel Munoz
(74) *Attorney, Agent, or Firm* — Cha & Reiter, LLC.

(57) ABSTRACT

Disclosed is an electronic device that includes a housing including a first plate, a second plate, and a side member, a ground layer, a display, a communication circuit, and a processor. The side member includes a first conductive part, a second conductive part, and a non-conductive part in contact with the first conductive part and the second conductive part and interposed between the first conductive part and the second conductive part. The first conductive part may be electrically coupled with the second conductive part. The ground layer may be electrically coupled with a partial section of the first conductive part that is adjacent to the second conductive part. The communication circuit may be electrically connected with the first conductive part and the second conductive part.

19 Claims, 26 Drawing Sheets

(51) Int. Cl.
  *H01Q 5/371*   (2015.01)
  *H01Q 7/00*    (2006.01)
  *H01Q 1/48*    (2006.01)
  *H01Q 21/28*   (2006.01)
  *H01Q 9/42*    (2006.01)
  *H01Q 5/328*   (2015.01)
  *H04M 1/02*    (2006.01)
  *H05K 9/00*    (2006.01)
  *H01Q 9/30*    (2006.01)

(52) U.S. Cl.
  CPC .............. *H01Q 7/00* (2013.01); *H01Q 9/0421* (2013.01); *H01Q 9/42* (2013.01); *H01Q 21/28* (2013.01); *H04M 1/0202* (2013.01); *H01Q 9/30* (2013.01); *H04M 1/026* (2013.01); *H05K 9/006* (2013.01)

(56) References Cited

U.S. PATENT DOCUMENTS

| | | |
|---|---|---|
| 8,547,289 B2 | 10/2013 | Montgomery et al. |
| 8,803,756 B2 | 8/2014 | Montgomery et al. |
| 9,318,803 B2 | 4/2016 | Montgomery et al. |
| 9,660,337 B2 | 5/2017 | Montgomery et al. |
| 2008/0278405 A1 | 11/2008 | Montgomery et al. |
| 2011/0080332 A1 | 4/2011 | Montgomery et al. |
| 2012/0299792 A1 | 11/2012 | Montgomery et al. |
| 2014/0062819 A1 | 3/2014 | Montgomery et al. |
| 2014/0340274 A1 | 11/2014 | Montgomery et al. |
| 2016/0190684 A1 | 6/2016 | Montgomery et al. |
| 2016/0233574 A1 | 8/2016 | Xiong et al. |
| 2017/0033812 A1 | 2/2017 | Son et al. |
| 2017/0244156 A1 | 8/2017 | Montgomery et al. |

ELECTRONIC DEVICE INCLUDING ANTENNA

CROSS-REFERENCE TO RELATED APPLICATION(S)

This application is based on and claims priority under 35 U.S.C. § 119 to Korean Patent Application No. 10-2017-0024568, filed on Feb. 24, 2017, in the Korean Intellectual Property Office, the disclosure of which is incorporated by reference herein its entirety.

TECHNICAL FIELD

Embodiments of the present disclosure generally relate to design for an antenna included in an electronic device.

BACKGROUND

Wireless communication technologies enable transmission and reception of various forms of information, such as text, images, videos, speech, or the like. As these wireless communication technologies have progressed, their speed and capabilities have steadily improved. And with the development of these wireless communication technologies, electronic devices capable of wireless communication, such as smartphones, tablet PCs, or the like, may provide services employing these wireless communication technologies, such as global positioning system (GPS), Wi-Fi, long term evolution (LTE), near field communication (NFC), magnetic stripe transmission (MST), or the like. To perform wireless communication, the electronic device may include an antenna. On the other hand, an electronic device supporting carrier aggregation (CA) or multi input-multi output (MIMO) may include a plurality of antennas.

The above information is presented as background information only to assist with an understanding of the present disclosure. No determination has been made, and no assertion is made, as to whether any of the above might be applicable as prior art with regard to the present disclosure.

SUMMARY

To enhance efficiency of the plurality of antennas included in an electronic device, the plurality of antennas are electrically isolated from one another. However, it may be difficult to electrically isolate the plurality of antennas since the size of the electronic device, such as a smartphone, a tablet PC, or a wearable device, is limited. In addition, achieving the necessary isolation may be difficult because the plurality of antennas in question may support the same band. Conventionally, isolation may be achieved by providing a switch that can switch between the plurality of antennas. However, such a conventional switch may degrade the radiation efficiency of the antennas.

Aspects of the present disclosure are to address at least the above-mentioned problems and/or disadvantages and to provide at least the advantages described below. Accordingly, an aspect of the present disclosure is to provide an antenna structure for supporting broadband communications and an antenna structure for electrically isolating a plurality of antennas.

In accordance with an aspect of the present disclosure, an electronic device includes a housing that includes a first plate, a second plate, and a side member surrounding an inner space of the electronic device between the first plate and the second plate, a display exposed through a portion of the first plate, at least one wireless communication circuit disposed inside the housing, and a processor disposed inside the housing and electrically connected with the display and the at least one wireless communication circuit. The side member includes a first conductive part, a second conductive part, and a first non-conductive part in contact with the first conductive part and the second conductive part and interposed between the first conductive part and the second conductive part. The first conductive part includes a conductive loop disposed adjacent to the first non-conductive part and protruding toward the inner space of the electronic device. The second conductive part includes a first conductive protrusion protruding toward the inner space of the electronic device and a second conductive protrusion protruding toward the inner space of the electronic device. The first conductive protrusion is disposed between the conductive loop and the second conductive protrusion. The at least one wireless communication circuit is electrically connected with the conductive loop and the second conductive protrusion.

In accordance with another aspect of the present disclosure, an electronic device includes a housing that includes a first plate, a second plate, and a side member surrounding an inner space of the electronic device between the first plate and the second plate, a ground layer spaced apart from the side member and disposed adjacent to at least a partial section of the side member, a display exposed through a portion of the first plate, a communication circuit disposed inside the housing, and a processor disposed inside the housing and electrically connected with the display and the communication circuit. The side member includes a first conductive part, a second conductive part, and a non-conductive part in contact with the first conductive part and the second conductive part and interposed between the first conductive part and the second conductive part. The first conductive part is electrically coupled with the second conductive part. The ground layer is electrically coupled with a partial section of the first conductive part that is adjacent to the second conductive part. The communication circuit is electrically connected with the first conductive part and the second conductive part.

In accordance with another aspect of the present disclosure, an electronic device includes a housing that includes a first plate, a second plate, and a side member surrounding an inner space of the electronic device between the first plate and the second plate, a ground plate spaced apart from the side member and disposed adjacent to at least a partial section of the side member, a display exposed through a portion of the first plate, a communication circuit disposed inside the housing, and a processor disposed inside the housing and electrically connected with the display and the communication circuit. The side member includes a first conductive part, a second conductive part, a third conductive part, a first non-conductive part in contact with the first conductive part and the second conductive part and interposed between the first conductive part and the second conductive part, and a second non-conductive part in contact with the first conductive part and the third conductive part and interposed between the first conductive part and the third conductive part. The second conductive part includes a first conductive protrusion adjacent to the first non-conductive part and protruding toward the inner space of the electronic device and a second conductive protrusion protruding toward the inner space of the electronic device. The first conductive protrusion is disposed between the first conductive part and the second conductive protrusion. The first conductive part is electrically coupled with the second conductive part and the third conductive part. The ground plate is electrically coupled with a partial section of the first conductive part that is adjacent to the third conductive part. The communication circuit is electrically connected with the first conductive part, the second conductive protrusion, and the third conductive part.

According to embodiments disclosed herein, by adding one or more protrusion to one or more portions where antenna radiators are adjacent to one another, it is possible to implement an antenna radiator having advantageous broadband performance.

Furthermore, by arranging a grounded coupling area so that it electrically couples to a partial section of the antenna radiator, it is possible to better isolate the bands of the antenna radiators.

In addition, the present disclosure may provide various effects and advantages that are directly or indirectly recognized.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
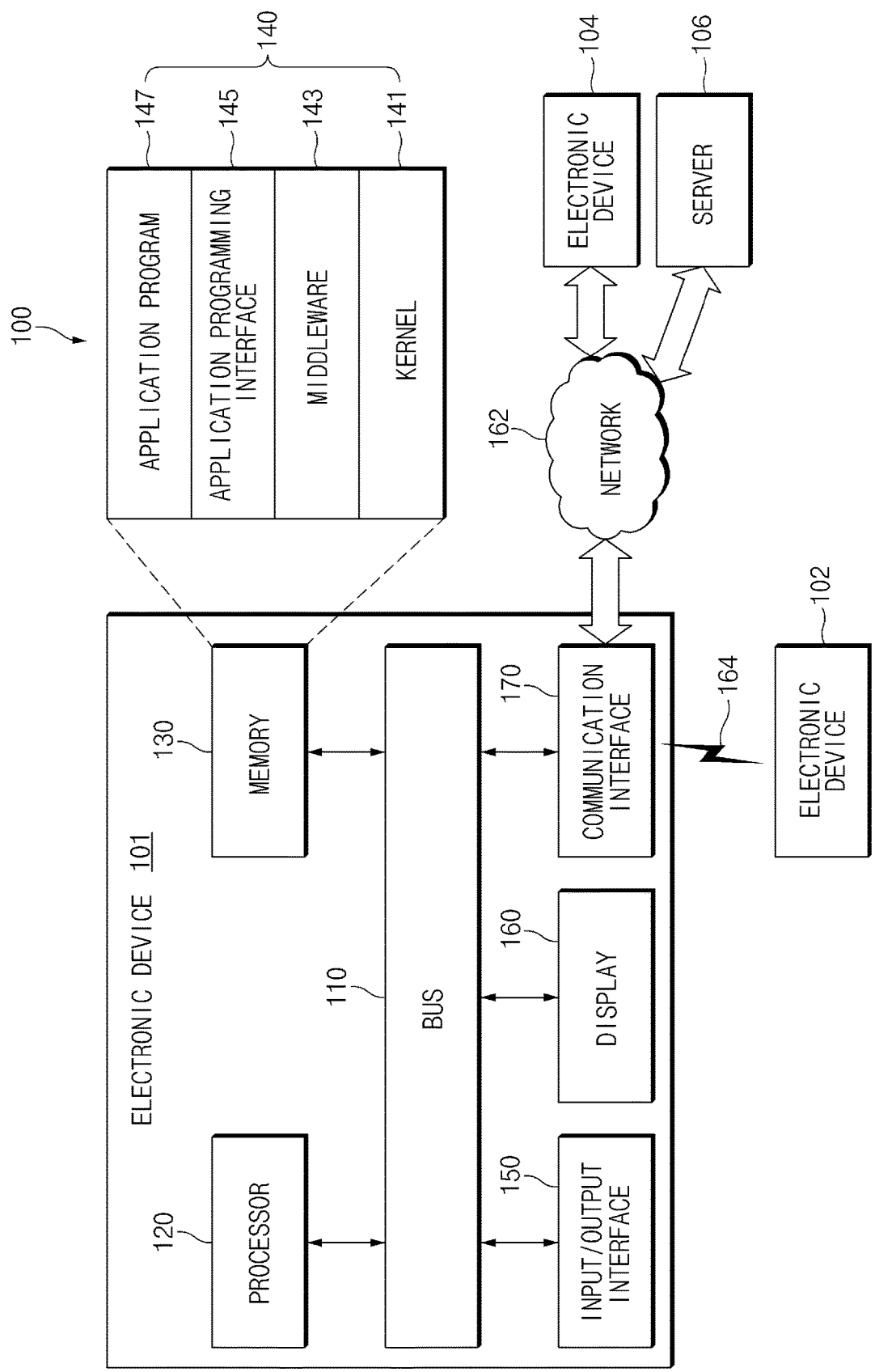
FIG. 1 is a block diagram illustrating an electronic device in a network environment according to an embodiment.

Hereinafter, various embodiments of the present disclosure may be described with reference to accompanying drawings. Accordingly, those of ordinary skill in the art will recognize that modification, equivalent, and/or alternative on the various embodiments described herein can be variously made without departing from the scope and spirit of the present disclosure. Terms expressed as singulars may also refer to the plural unless otherwise specified. In this disclosure, the expressions "A or B," "at least one of A or/and B," or "one or more of A or/and B," and the like may include any and all combinations of one or more of the associated listed items. The terms such as "first," "second," and the like may be used to refer to various elements regardless of the order and/or the priority and to distinguish the associated elements from other elements, but do not limit the elements. When an element (e.g., a first element) is referred to as being "(operatively or communicatively) coupled with/to" or "connected to" another element (e.g., a second element), the element may be directly coupled with/to or connected to the other element or an intervening element (e.g., a third element) may be present.

According to the situation, the expression "configured to" used in this disclosure may be used as, for example, the expression "suitable for," "having the capacity to," "adapted to," "made to," "capable of," or "designed to" in hardware or software. The expression "a device configured to" may mean that the device is "capable of" operating together with another device or other components. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

An electronic device according to various embodiments of this disclosure may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, medical devices, cameras, or wearable devices. According to various embodiments, the wearable device may include at least one of an accessory type (e.g., watches, rings, bracelets, anklets, necklaces, glasses, contact lens, or head-mounted-devices (HMDs), a fabric or garment-integrated type (e.g., an electronic apparel), a body-attached type (e.g., a skin pad or tattoos), or a bio-implantable type (e.g., an implantable circuit). According to various embodiments, the electronic device may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, media boxes (e.g., Samsung HomeSync™, Apple TV™, or Google TV™), game consoles (e.g., Xbox™ or PlayStation™), electronic dictionaries, electronic keys, camcorders, electronic picture frames, and the like.

According to another embodiment, an electronic device may include at least one of various medical devices (e.g., various portable medical measurement devices (e.g., a blood glucose monitoring device, a heartbeat measuring device, a blood pressure measuring device, a body temperature measuring device, and the like), a magnetic resonance angiography (MRA) device, a magnetic resonance imaging (MRI) device, a computed tomography (CT) device, scanners, and ultrasonic devices), navigation devices, Global Navigation Satellite System (GNSS), event data recorders (EDRs), flight data recorders (FDRs), vehicle infotainment devices, electronic equipment for vessels (e.g., navigation systems and gyrocompasses), avionics, security devices, head units for vehicles, industrial or home robots, drones, automatic teller's machines (ATMs), points of sales (POSs) of stores, or internet of things (e.g., light bulbs, various sensors, sprinkler devices, fire alarms, thermostats, street lamps, toasters, exercise equipment, hot water tanks, heaters, boilers, and the like). According to an embodiment, the electronic device may include at least one of parts of furniture or buildings/structures, electronic boards, electronic signature receiving devices, projectors, or various measuring instruments (e.g., water meters, electricity meters, gas meters, or wave meters, and the like). According to various embodiments, the electronic device may be a flexible electronic device or a combination of two or more above-described devices. Furthermore, an electronic device according to an embodiment of this disclosure may not be limited to the above-described electronic devices. In this disclosure, the term "user" may refer to a person who uses an electronic device or may refer to a device (e.g., an artificial intelligence electronic device) that uses the electronic device.

Referring to FIG. 1, according to one embodiment, an electronic device 101 in a network environment is described. The electronic device 101 may include a bus 110, a processor 120, a memory 130, an input/output interface 150, a display 160, and a communication interface 170. According to an embodiment, the electronic device 101 may not include at least one of the above-described elements or may further include other element(s). The bus 110 may interconnect the above-described elements 110 to 170 and may include a circuit for conveying communications (e.g., a control message and/or data) among the above-described elements. The processor 120 may include one or more of a central processing unit (CPU), an application processor (AP), or a communication processor (CP). For example, the processor 120 may perform an arithmetic operation or data processing associated with control and/or communication of at least other elements of the electronic device 101. The processor 120 may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Any of the functions and steps provided in the Figures may be implemented in hardware, software or a combination of both and may be performed in whole or in part within the programmed instructions of a computer. No claim element herein is to be construed under the provisions of 35 U.S.C. 112(f), unless the element is expressly recited using the phrase "means for." In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

The memory 130 may include a volatile and/or nonvolatile memory. For example, the memory 130 may store instructions or data associated with at least one other element(s) of the electronic device 101. According to an embodiment, the memory 130 may store software and/or a program 140. The program 140 may include, for example, a kernel 141, a middleware 143, an application programming interface (API) 145, and/or an application program (or "an application") 147. At least a part of the kernel 141, the middleware 143, or the API 145 may be referred to as an "operating system (OS)". For example, the kernel 141 may control or manage system resources (e.g., the bus 110, the processor 120, the memory 130, and the like) that are used to execute operations or functions of other programs (e.g., the middleware 143, the API 145, and the application program 147). Furthermore, the kernel 141 may provide an interface that allows the middleware 143, the API 145, or the application program 147 to access discrete elements of the electronic device 101 so as to control or manage system resources.

The middleware 143 may perform, for example, a mediation role such that the API 145 or the application program 147 communicates with the kernel 141 to exchange data. Furthermore, the middleware 143 may process one or more task requests received from the application program 147 according to a priority. For example, the middleware 143 may assign the priority, which makes it possible to use a system resource (e.g., the bus 110, the processor 120, the memory 130, or the like) of the electronic device 101, to at least one of the application program 147 and may process the one or more task requests. The API 145 may be an interface through which the application program 147 controls a function provided by the kernel 141 or the middleware 143, and may include, for example, at least one interface or function (e.g., an instruction) for a file control, a window control, image processing, a character control, or the like. The input/output interface 150 may transmit an instruction or data input from a user or another external device, to other element(s) of the electronic device 101 or may output an instruction or data, received from other element(s) of the electronic device 101, to a user or another external device.

The display 160 may include, for example, a liquid crystal display (LCD), a light-emitting diode (LED) display, an organic LED (OLED) display, a microelectromechanical systems (MEMS) display, or an electronic paper display. The display 160 may display, for example, various contents (e.g., a text, an image, a video, an icon, a symbol, and the like) to a user. The display 160 may include a touch screen and may receive, for example, a touch, gesture, proximity, or hovering input using an electronic pen or a part of a user's body. For example, the communication interface 170 may establish communication between the electronic device 101 and an external device (e.g., the first electronic device 102, the second electronic device 104, or the server 106). For example, the communication interface 170 may be connected to the network 162 over wireless communication or wired communication to communicate with the external device (e.g., the second electronic device 104 or the server 106).

For example, the wireless communication may include cellular communication using at least one of long-term evolution (LTE), LTE Advanced (LTE-A), Code Division Multiple Access (CDMA), Wideband CDMA (WCDMA), Universal Mobile Telecommunications System (UMTS), Wireless Broadband (WiBro), Global System for Mobile Communications (GSM), or the like. The wireless communication may include at least one of wireless fidelity (Wi-Fi), Bluetooth, Bluetooth low energy (BLE), Zigbee, near field communication (NFC), magnetic stripe transmission (MST), radio frequency (RF), a body area network, or the like. According to an embodiment, the wireless communication may include GNSS. The GNSS may be one of, for example, a global positioning system (GPS), a global navigation satellite system (Glonass), a Beidou navigation satellite system (hereinafter referred to as "Beidou"), or an European global satellite-based navigation system (hereinafter referred to as "Galileo"). Hereinafter, in this disclosure, "GPS" and "GNSS" may be interchangeably used. The wired communication may include at least one of, for example, a universal serial bus (USB), a high definition multimedia interface (HDMI), a recommended standard-232 (RS-232), power line communication, a plain old telephone service (POTS), or the like. The network 162 may include at least one of telecommunications networks, for example, a computer network (e.g., LAN or WAN), an Internet, or a telephone network.

Each of the first and second external electronic devices 102 and 104 may be a device of which the type is different from or the same as that of the electronic device 101. According to various embodiments, all or a portion of operations that the electronic device 101 will perform may be executed by another or plural electronic devices (e.g., the first electronic device 102, the second electronic device 104 or the server 106). According to an embodiment, in the case where the electronic device 101 executes any function or service automatically or in response to a request, the electronic device 101 may not perform the function or the service internally, but, alternatively additionally, it may request at least a portion of a function associated with the electronic device 101 at other electronic device (e.g., the electronic device 102 or 104 or the server 106). The other electronic device (e.g., the electronic device 102 or 104 or the server 106) may execute the requested function or additional function and may transmit the execution result to the electronic device 101. The electronic device 101 may provide the requested function or service using the received result or may additionally process the received result to provide the requested function or service. To this end, for example, cloud computing, distributed computing, or client-server computing may be used.

Figure 2:
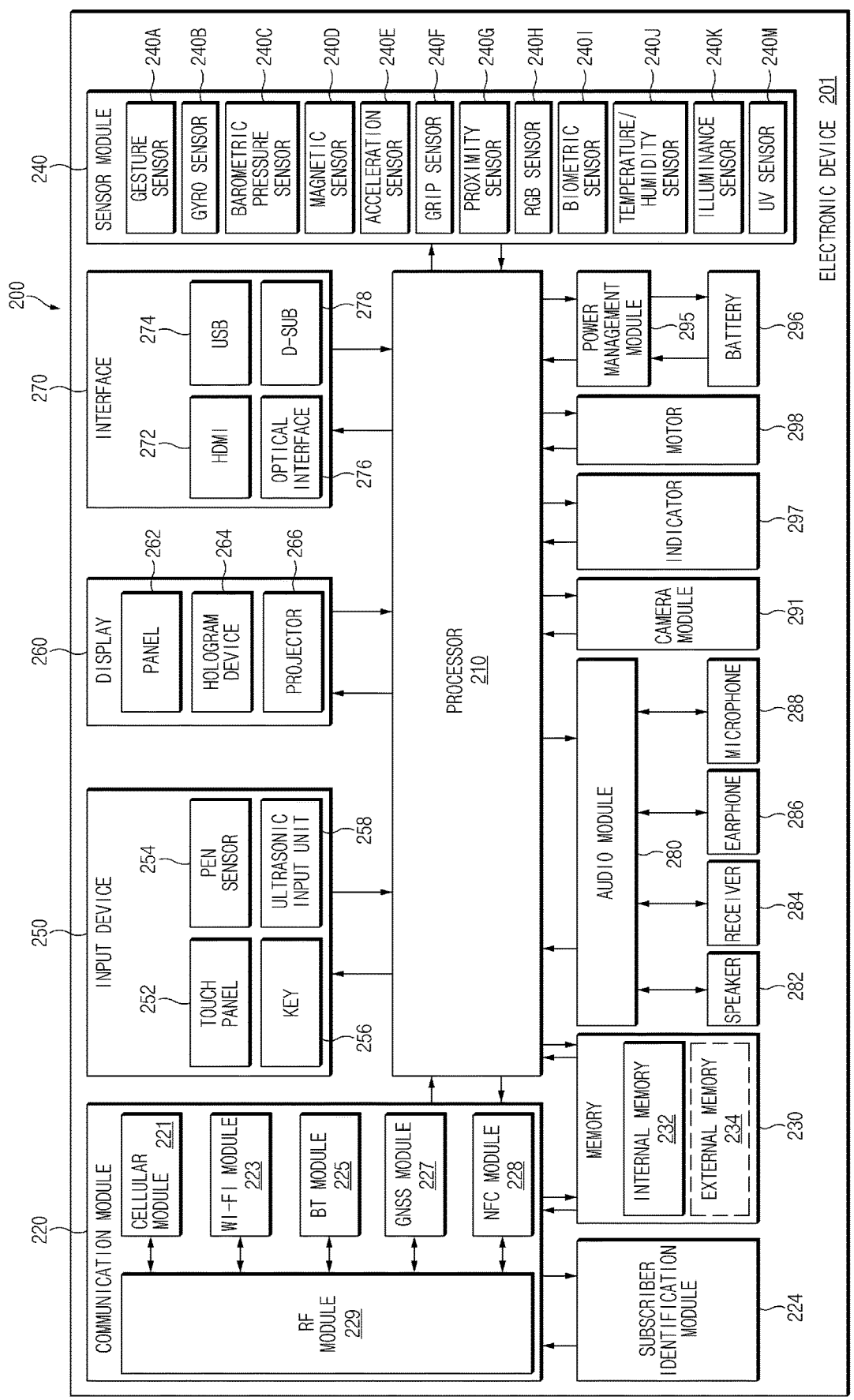
FIG. 2 is a block diagram illustrating an electronic device according to an embodiment.

FIG. 2 illustrates a block diagram of an electronic device, according to one embodiment. An electronic device 201 may include, for example, all or a part of the electronic device 101 illustrated in FIG. 1. The electronic device 201 may include one or more processors (e.g., an application processor (AP)) 210, a communication module 220, a subscriber identification module 224, a memory 230, a sensor module 240, an input device 250, a display 260, an interface 270, an audio module 280, a camera module 291, a power management module 295, a battery 296, an indicator 297, and a motor 298. For example, the processor 210 may be implemented with a System on Chip (SoC). According to an embodiment, the processor 210 may further include a graphic processing unit (GPU) and/or an image signal processor. The processor 210 may include at least a part (e.g., a cellular module 221) of elements illustrated in FIG. 2. The processor 210 may load a command or data, which is received from at least one of other elements (e.g., a nonvolatile memory), into a volatile memory and process the loaded instruction or data. The processor 210 may store result data in the nonvolatile memory.

The communication module 220 may be configured the same as or similar to the communication interface 170 of FIG. 1. The communication module 220 may include the cellular module 221, a Wi-Fi module 223, a Bluetooth (BT) module 225, a GNSS module 227, a near field communication (NFC) module 228, and a radio frequency (RF) module 229. The cellular module 221 may provide, for example, voice communication, video communication, a character service, an Internet service, or the like over a communication network. According to an embodiment, the cellular module 221 may perform discrimination and authentication of the electronic device 201 within a communication network by using the subscriber identification module (e.g., a SIM card) 224. According to an embodiment, the cellular module 221 may perform at least a portion of functions that the processor 210 provides. According to an embodiment, the cellular module 221 may include a communication processor (CP). According to an embodiment, at least a part (e.g., two or more) of the cellular module 221, the Wi-Fi module 223, the BT module 225, the GNSS module 227, or the NFC module 228 may be included within one Integrated Circuit (IC) or an IC package. For example, the RF module 229 may transmit and receive a communication signal (e.g., an RF signal). For example, the RF module 229 may include a transceiver, a power amplifier module (PAM), a frequency filter, a low noise amplifier (LNA), an antenna, or the like. According to another embodiment, at least one of the cellular module 221, the Wi-Fi module 223, the BT module 225, the GNSS module 227, or the NFC module 228 may transmit and receive an RF signal through a separate RF module. The subscriber identification module 224 may include, for example, a card and/or embedded SIM that includes a subscriber identification module and may include unique identify information (e.g., integrated circuit card identifier (ICCID)) or subscriber information (e.g., international mobile subscriber identity (IMSI)).

The memory 230 (e.g., the memory 130) may include an internal memory 232 or an external memory 234. For example, the internal memory 232 may include at least one of a volatile memory (e.g., a dynamic random access memory (DRAM), a static RAM (SRAM), a synchronous DRAM (SDRAM), or the like), a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory, a hard drive, or a solid state drive (SSD). The external memory 234 may include a flash drive such as compact flash (CF), secure digital (SD), micro secure digital (Micro-SD), mini secure digital (Mini-SD), extreme digital (xD), a multimedia card (MMC), a memory stick, or the like. The external memory 234 may be operatively and/or physically connected to the electronic device 201 through various interfaces.

The sensor module 240 may measure, for example, a physical quantity or may detect an operation state of the electronic device 201. The sensor module 240 may convert the measured or detected information to an electric signal. For example, the sensor module 240 may include at least one of a gesture sensor 240A, a gyro sensor 240B, a barometric pressure sensor 240C, a magnetic sensor 240D, an acceleration sensor 240E, a grip sensor 240F, the proximity sensor 240G, a color sensor 240H (e.g., red, green, blue (RGB) sensor), a biometric sensor 240I, a temperature/humidity sensor 240J, an illuminance sensor 240K, or an UV sensor 240M. Although not illustrated, additionally or generally, the sensor module 240 may further include, for example, an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit for controlling at least one or more sensors included therein. According to an embodiment, the electronic device 201 may further include a processor that is a part of the processor 210 or independent of the processor 210 and is configured to control the sensor module 240. The processor may control the sensor module 240 while the processor 210 remains at a sleep state.

The input device 250 may include, for example, a touch panel 252, a (digital) pen sensor 254, a key 256, or an ultrasonic input unit 258. For example, the touch panel 252 may use at least one of capacitive, resistive, infrared and ultrasonic detecting methods. Also, the touch panel 252 may further include a control circuit. The touch panel 252 may further include a tactile layer to provide a tactile reaction to a user. The (digital) pen sensor 254 may be, for example, a part of a touch panel or may include an additional sheet for recognition. The key 256 may include, for example, a physical button, an optical key, or a keypad. The ultrasonic input device 258 may detect (or sense) an ultrasonic signal, which is generated from an input device, through a microphone (e.g., a microphone 288) and may check data corresponding to the detected ultrasonic signal.

The display 260 (e.g., the display 160) may include a panel 262, a hologram device 264, a projector 266, and/or a control circuit for controlling the panel 262, the hologram device 264, or the projector 266. The panel 262 may be implemented, for example, to be flexible, transparent or wearable. The panel 262 and the touch panel 252 may be integrated into a single module. According to an embodiment, the panel 262 may include a pressure sensor (or force sensor) that measures the intensity of touch pressure by a user. The pressure sensor may be implemented integrally with the touch panel 252, or may be implemented as at least one sensor separately from the touch panel 252. The hologram device 264 may display a stereoscopic image in a space using a light interference phenomenon. The projector 266 may project light onto a screen so as to display an image. For example, the screen may be arranged in the inside or the outside of the electronic device 201. The interface 270 may include, for example, a high-definition multimedia interface (HDMI) 272, a universal serial bus (USB) 274, an optical interface 276, or a D-subminiature (D-sub) 278. The interface 270 may be included, for example, in the communication interface 170 illustrated in FIG. 1. Additionally or generally, the interface 270 may include, for example, a mobile high definition link (MHL) interface, a SD card/multimedia card (MMC) interface, or an infrared data association (IrDA) standard interface.

The audio module 280 may convert a sound and an electric signal in dual directions. At least a part of the audio module 280 may be included, for example, in the input/output interface 150 illustrated in FIG. 1. The audio module 280 may process, for example, sound information that is input or output through a speaker 282, a receiver 284, an earphone 286, or the microphone 288. For example, the camera module 291 may shoot a still image or a video. According to an embodiment, the camera module 291 may include at least one or more image sensors (e.g., a front sensor or a rear sensor), a lens, an image signal processor (ISP), or a flash (e.g., an LED or a xenon lamp). The power management module 295 may manage, for example, power of the electronic device 201. According to an embodiment, a power management integrated circuit (PMIC), a charger IC, or a battery or fuel gauge may be included in the power management module 295. The PMIC may have a wired charging method and/or a wireless charging method. The wireless charging method may include, for example, a magnetic resonance method, a magnetic induction method or an electromagnetic method and may further include an additional circuit, for example, a coil loop, a resonant circuit, a rectifier, or the like. The battery gauge may measure, for example, a remaining capacity of the battery 296 and a voltage, current or temperature thereof while the battery is charged. The battery 296 may include, for example, a rechargeable battery and/or a solar battery.

The indicator 297 may display a specific state of the electronic device 201 or a part thereof (e.g., the processor 210), such as a booting state, a message state, a charging state, and the like. The motor 298 may convert an electrical signal into a mechanical vibration and may generate the following effects: vibration, haptic, and the like. The electronic device 201 may include a processing device (e.g., a GPU) for supporting a mobile TV. The processing device for supporting the mobile TV may process media data according to the standards of digital multimedia broadcasting (DMB), digital video broadcasting (DVB), MediaFLO™, or the like. Each of the above-mentioned elements of the electronic device according to various embodiments of the present disclosure may be configured with one or more components, and the names of the elements may be changed according to the type of the electronic device. In various embodiments, some elements of the electronic device (e.g., the electronic device 201) may be omitted or other additional elements may be added. Furthermore, some of the elements of the electronic device may be combined with each other so as to form one entity, so that the functions of the elements may be performed in the same manner as before the combination.

Figure 3:
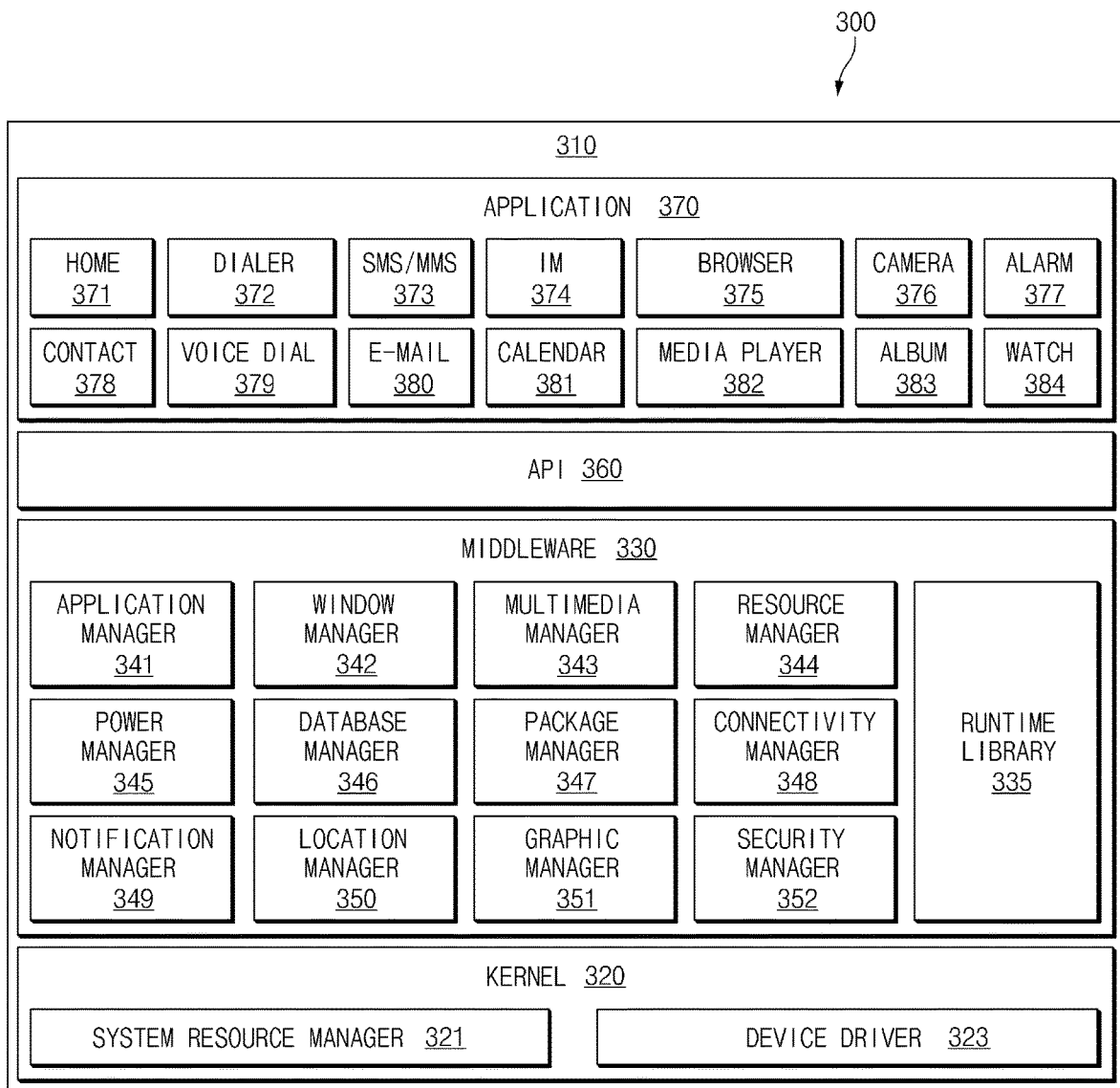
FIG. 3 is a block diagram illustrating a program module according to an embodiment.

FIG. 3 illustrates a block diagram of a program module, according to one embodiment. According to an embodiment, a program module 310 (e.g., the program 140) may include an operating system (OS) to control resources associated with an electronic device (e.g., the electronic device 101), and/or diverse applications (e.g., the application program 147) driven on the OS. The OS may be, for example, Android™, iOS™, Windows™, Symbian™, Tizen™, or Bada™. The program module 310 may include a kernel 320 (e.g., the kernel 141), a middleware 330 (e.g., the middleware 143), an application programming interface (API) 360 (e.g., the API 145), and/or an application 370 (e.g., the application program 147). At least a portion of the program module 310 may be preloaded on an electronic device or may be downloadable from an external electronic device (e.g., the first electronic device 102, the second electronic device 104, the server 106, or the like).

The kernel 320 (e.g., the kernel 141) may include, for example, a system resource manager 321 or a device driver 323. The system resource manager 321 may control, allocate, or retrieve system resources. According to an embodiment, the system resource manager 321 may include a process managing unit, a memory managing unit, a file system managing unit, or the like. The device driver 323 may include, for example, a display driver, a camera driver, a Bluetooth driver, a shared memory driver, a USB driver, a keypad driver, a Wi-Fi driver, an audio driver, or an inter-process communication (IPC) driver. The middleware 330 may provide, for example, a function that the application 370 needs in common, or may provide diverse functions to the application 370 through the API 360 to allow the application 370 to efficiently use limited system resources of the electronic device. According to an embodiment, the middleware 330 may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, or a security manager 352.

The runtime library 335 may include, for example, a library module that is used by a compiler to add a new function through a programming language while the application 370 is being executed. The runtime library 335 may perform input/output management, memory management, or capacities about arithmetic functions. The application manager 341 may manage, for example, a life cycle of at least one application of the application 370. The window manager 342 may manage a graphic user interface (GUI) resource that is used in a screen. The multimedia manager 343 may identify a format necessary for playing diverse media files, and may perform encoding or decoding of media files by using a codec suitable for the format. The resource manager 344 may manage resources such as a memory space or source code of the application 370. The power manager 345 may manage a battery or power, and may provide power information for an operation of an electronic device. According to an embodiment, the power manager 345 may operate with a basic input/output system (BIOS). The database manager 346 may generate, search for, or modify database that is to be used in the application 370. The package manager 347 may install or update an application that is distributed in the form of package file.

The connectivity manager 348 may manage, for example, wireless connection. The notification manager 349 may provide an event, for example, arrival message, appointment, or proximity notification to a user. For example, the location manager 350 may manage location information about an electronic device. The graphic manager 351 may manage a graphic effect that is provided to a user, or manage a user interface relevant thereto. The security manager 352 may provide, for example, system security or user authentication. According to an embodiment, the middleware 330 may include a telephony manager for managing a voice or video call function of the electronic device or a middleware module that combines diverse functions of the above-described elements. According to an embodiment, the middleware 330 may provide a module specialized to each OS kind to provide differentiated functions. Additionally, the middleware 330 may dynamically remove a part of the preexisting elements or may add new elements thereto. The API 360 may be, for example, a set of programming functions and may be provided with a configuration that is variable depending on an OS. For example, in the case where the OS is android or iOS, it may provide one API set per platform. In the case where the OS is Tizen, it may provide two or more API sets per platform.

The application 370 may include, for example, applications such as a home 371, a dialer 372, an SMS/MMS 373, an instant message (IM) 374, a browser 375, a camera 376, an alarm 377, a contact 378, a voice dial 379, an e-mail 380, a calendar 381, a media player 382, an album 383, a watch 384, health care (e.g., measuring an exercise quantity, blood sugar, or the like) or offering of environment information (e.g., information of barometric pressure, humidity, temperature, or the like). According to an embodiment, the application 370 may include an information exchanging application to support information exchange between an electronic device and an external electronic device. The information exchanging application may include, for example, a notification relay application for transmitting specific information to an external electronic device, or a device management application for managing the external electronic device. For example, the notification relay application may include a function of transmitting notification information, which arise from other applications, to an external electronic device or may receive, for example, notification information from an external electronic device and provide the notification information to a user. The device management application may install, delete, or update for example, a function (e.g., turn-on/turn-off of an external electronic device itself (or a part of components) or adjustment of brightness (or resolution) of a display) of the external electronic device which communicates with the electronic device, and an application running in the external electronic device. According to an embodiment, the application 370 may include an application (e.g., a health care application of a mobile medical device) that is assigned in accordance with an attribute of an external electronic device. According to an embodiment, the application 370 may include an application that is received from an external electronic device. At least a portion of the program module 310 may be implemented by software, firmware, hardware (e.g., the processor 210), or a combination (e.g., execution) of two or more thereof, and may include modules, programs, routines, sets of instructions, processes, or the like for performing one or more functions.

Figure 4:
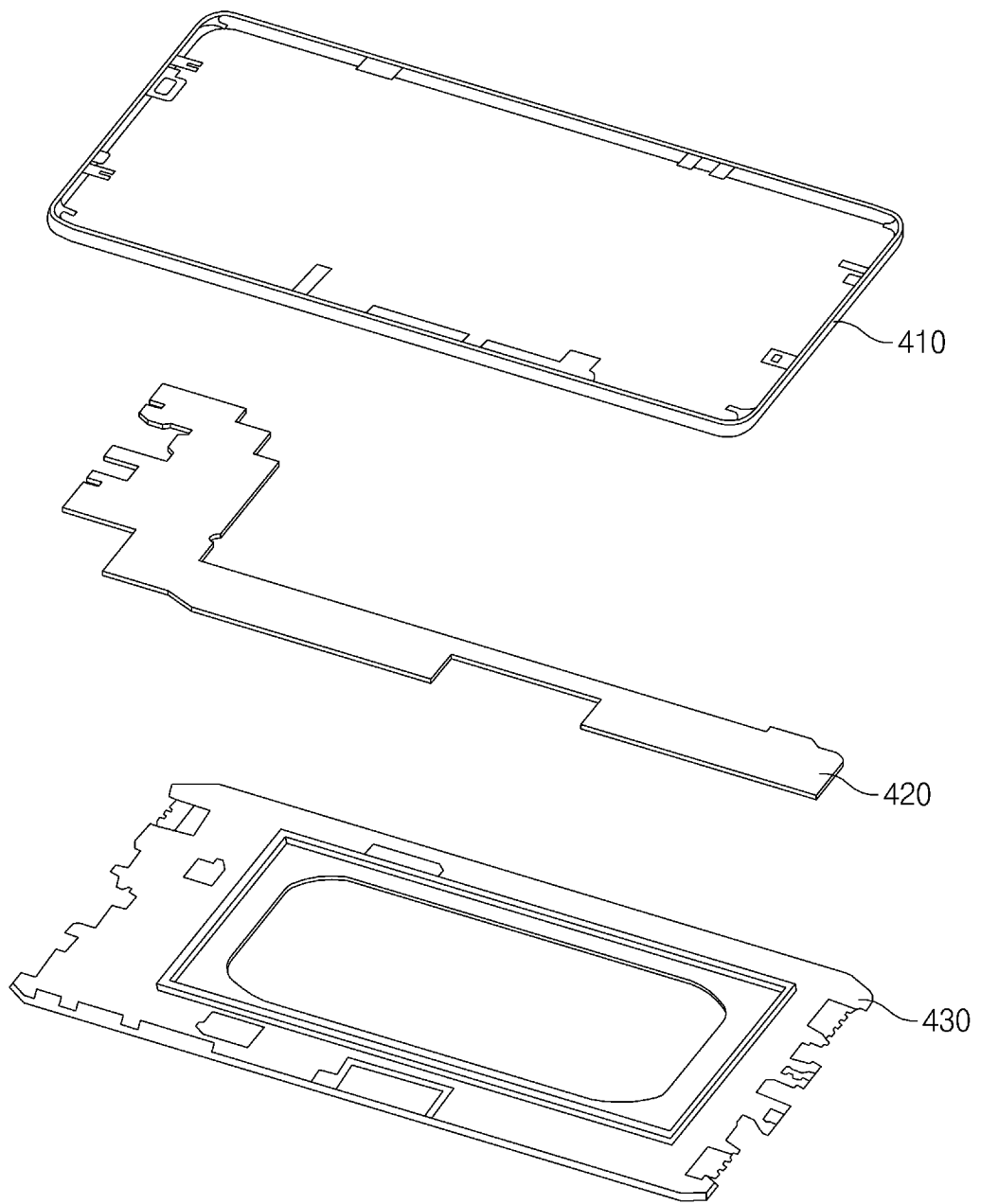
FIG. 4 is an exploded perspective view of a part of an electronic device according to an embodiment.

FIG. 4 is an exploded perspective view of a part of an electronic device according to an embodiment.

Referring to FIG. 4, an electronic device (e.g., the electronic device 101 of FIG. 1 or the electronic device 201 of FIG. 2) according to an embodiment may include a side member (e.g., a lateral frame) 410, a printed circuit board 420, and a support member (e.g., a bracket) 430.

The side member 410 may be configured to surround a lateral side of the electronic device. For example, the side member 410 may be disposed to surround a space between a front plate (or a first plate, not illustrated) that covers a front side of the electronic device and a rear plate (or a second plate, also not illustrated) that covers a rear side of the electronic device. The rear plate may face away from the front plate. The side member 410 may include conductive parts and non-conductive parts. For example, the conductive parts of the side member 410 may be made of metal. The non-conductive parts of the side member 410 may be made of an insulator. At least some of the conductive parts of the side member 410 may be used as one or more radiators of an antenna included in the electronic device. A specific structure and function of the side member 410 will be described below in detail with reference to FIGS. 6A to 12.

The printed circuit board 420 may be disposed in the space surrounded by the side member 410. The printed circuit board 420 may provide the substrate for various components of the electronic device. For example, the printed circuit board 420 may include conductive lines that electrically interconnect the components disposed on the printed circuit board 420. The printed circuit board 420 may include a feeding line and a ground line that are electrically connected with the side member 410. The printed circuit board 420 may further include a ground plate.

The support member 430 may be disposed between the front plate and the printed circuit board 420. Further, the support member 430 may be disposed in the space surrounded by the side member 410. The support member 430 may support the printed circuit board 420. Also, the support member 430 may be made of metal. When seated, the support member 430 may also be disposed between the printed circuit board 420 and a display panel (not illustrated), and may shield electromagnetic interference between the printed circuit board 420 and the display panel.

Figure 5:
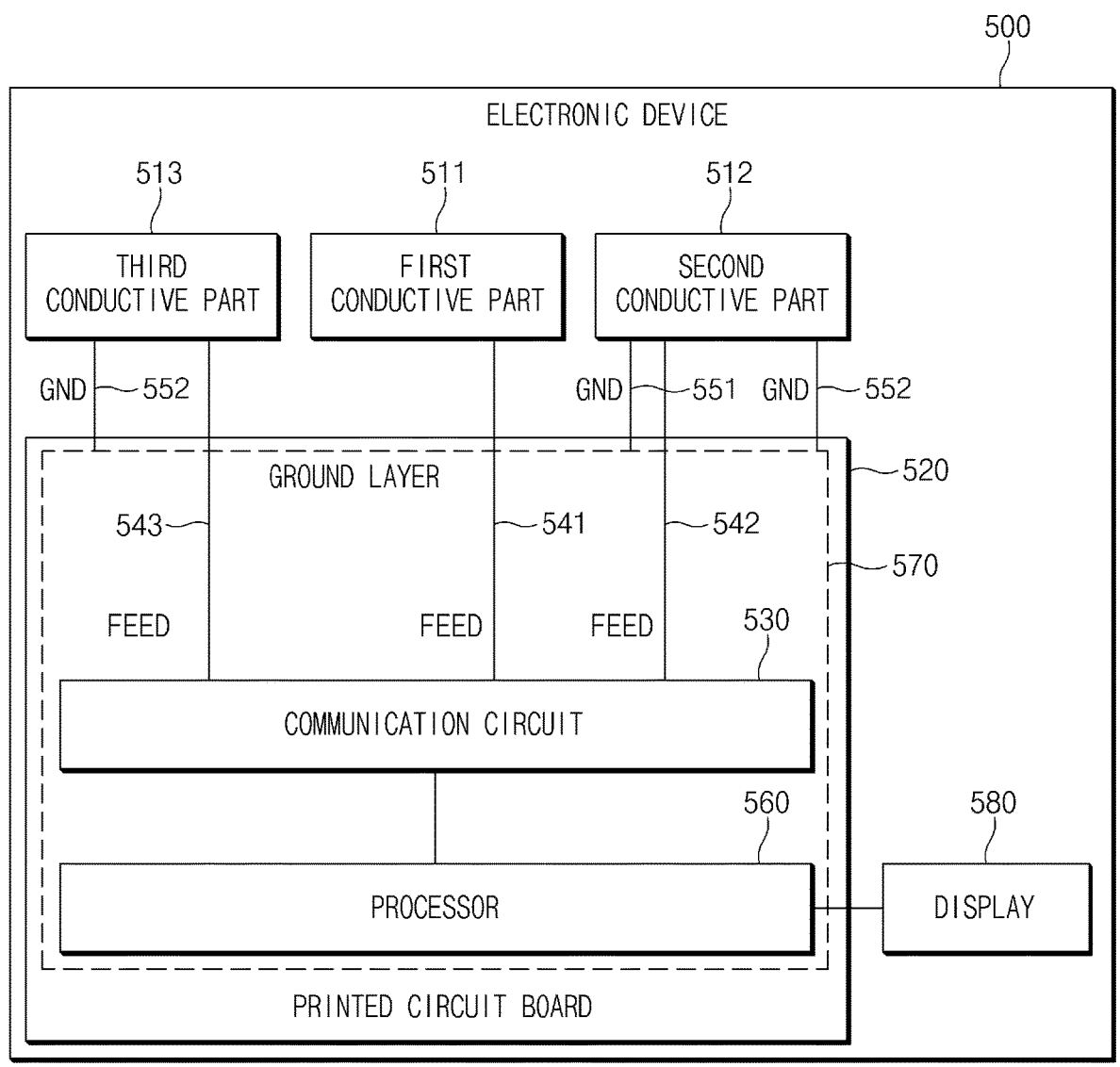
FIG. 5 is a block diagram illustrating a configuration of an electronic device according to an embodiment.

FIG. 5 is a block diagram illustrating a configuration of an electronic device according to an embodiment.

Referring to FIG. 5, an electronic device 500 (e.g., the electronic device 101 of FIG. 1 or the electronic device 201 of FIG. 2) according to an embodiment may include a first conductive part 511, a second conductive part 512, a third conductive part 513, a printed circuit board 520, a communication circuit 530, a processor 560, a ground layer 570, and a display 580.

According to an embodiment, the first conductive part 511, the second conductive part 512, and the third conductive part 513 may function as radiators of an antenna. The first conductive part 511, the second conductive part 512, and the third conductive part 513 may be individually configured to resonate at targeted frequencies. As disclosed above, the first conductive part 511, the second conductive part 512, and the third conductive part 513 may be portions of the side member 410 of FIG. 4.

The printed circuit board 520 (e.g. the printed circuit board 420) may provide the substrate for various elements of the electronic device 500. For example, the communication circuit 530 and the processor 560 may be disposed on the printed circuit board 520. The printed circuit board 520 may include feeding lines 541, 542, and 543 and ground lines 551, 552, and 553.

According to an embodiment, the ground layer 570 may be embedded in the printed circuit board 520. The ground layer 570 may be a portion of a support member (e.g., the support member 430). In addition, the ground layer 570 may be a ground of the display 580. In other embodiments, the ground layer 570 may be various other parts of the electronic device 500.

According to an embodiment, the ground layer 570 may be spaced apart from the first conductive part 511, the second conductive part 512, and the third conductive part 513. The ground layer 570 or a partial area thereof may be disposed adjacent to a partial section of the first conductive part 511, the second conductive part 512, or the third conductive part 513. For example, a partial area of the ground layer 570 may be disposed adjacent to a partial section of the first conductive part 511. When so arranged, the partial area of the ground layer 570 may be electrically coupled with the partial section of the first conductive part 511.

According to an embodiment, the second conductive part 512 may be grounded through the first ground line 551 and the second ground line 552. The third conductive part 513 may be grounded through the third ground line 553. More generally, the second conductive part 512 and the third conductive part 513 may be electrically connected with the ground layer 570 or another ground layer embedded in the printed circuit board 520 through various ground lines.

According to an embodiment, the communication circuit 530 may be electrically connected with the first conductive part 511, the second conductive part 512, and the third conductive part 513. For example, the communication circuit 530 may be connected with the first conductive part 511 through the first feeding line 541. The communication circuit 530 may be connected with the second conductive part 512 through the second feeding line 542. The communication circuit 530 may be connected with the third conductive part 513 through the third feeding line 543. The communication circuit 530 may receive electrical signals from the first conductive part 511, the second conductive part 512, and the third conductive part 513. Conversely, the communication circuit 530 may supply electrical signals to the first conductive part 511, the second conductive part 512, and the third conductive part 513. The communication circuit 530 may be an IC that supports wireless communications, such as GPS, Wi-Fi, and LTE, or may include a plurality of ICs, such as a GPS module, a Wi-Fi module, and an LTE module.

According to an embodiment, the processor 560 may be electrically connected with the communication circuit 530 and the display 580. The processor 560 may control the communication circuit 530 and the display 580. The processor 560 may also control other elements of the electronic device 500 (not shown) that are electrically connected with the processor 560.

According to an embodiment, the display 580 may be electrically connected with the processor 560. The display 580 may be controlled by the processor 560. The display 580 may be exposed through a front side the electronic device 500. The display 580 may be, for example, a touch screen display.

Figure 6A:
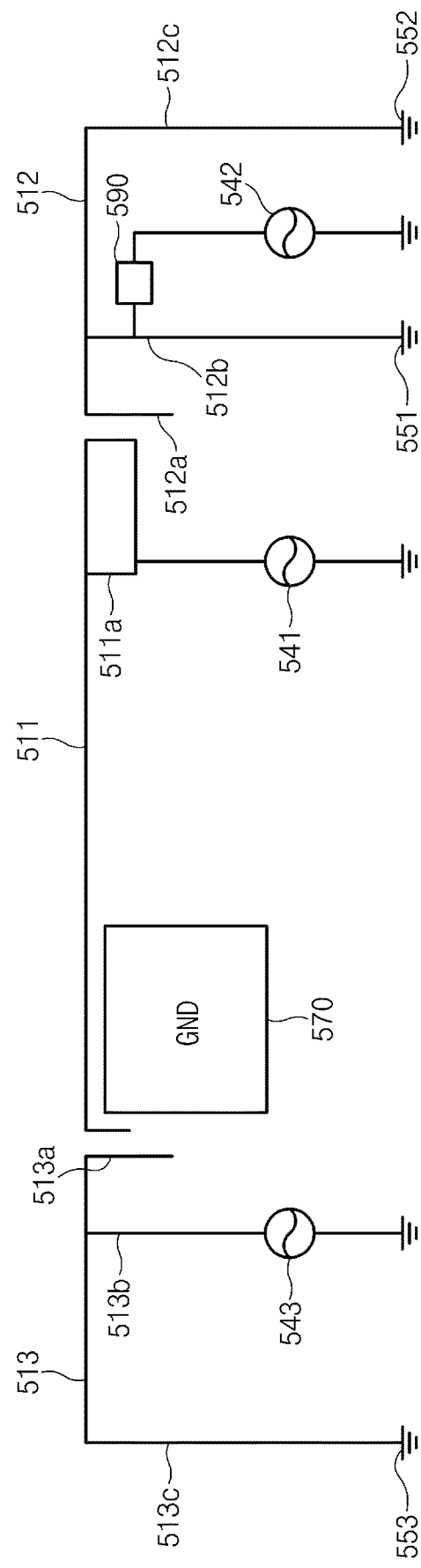
FIG. 6A and FIG. 6B are schematic diagrams illustrating structures of antennas included in electronic devices according to various embodiments.
Figure 6B:
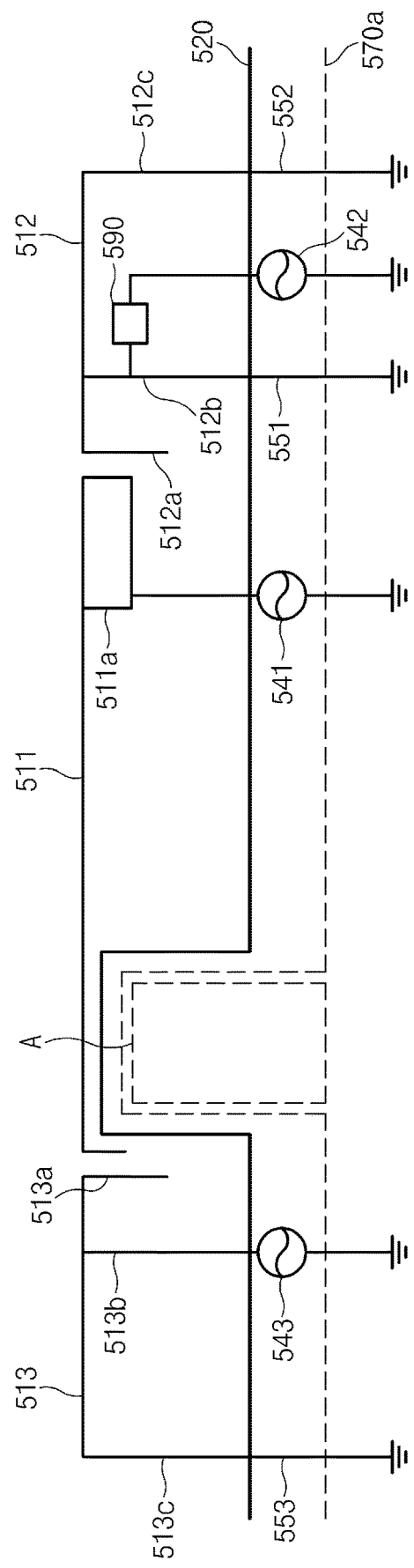
Figure 7:
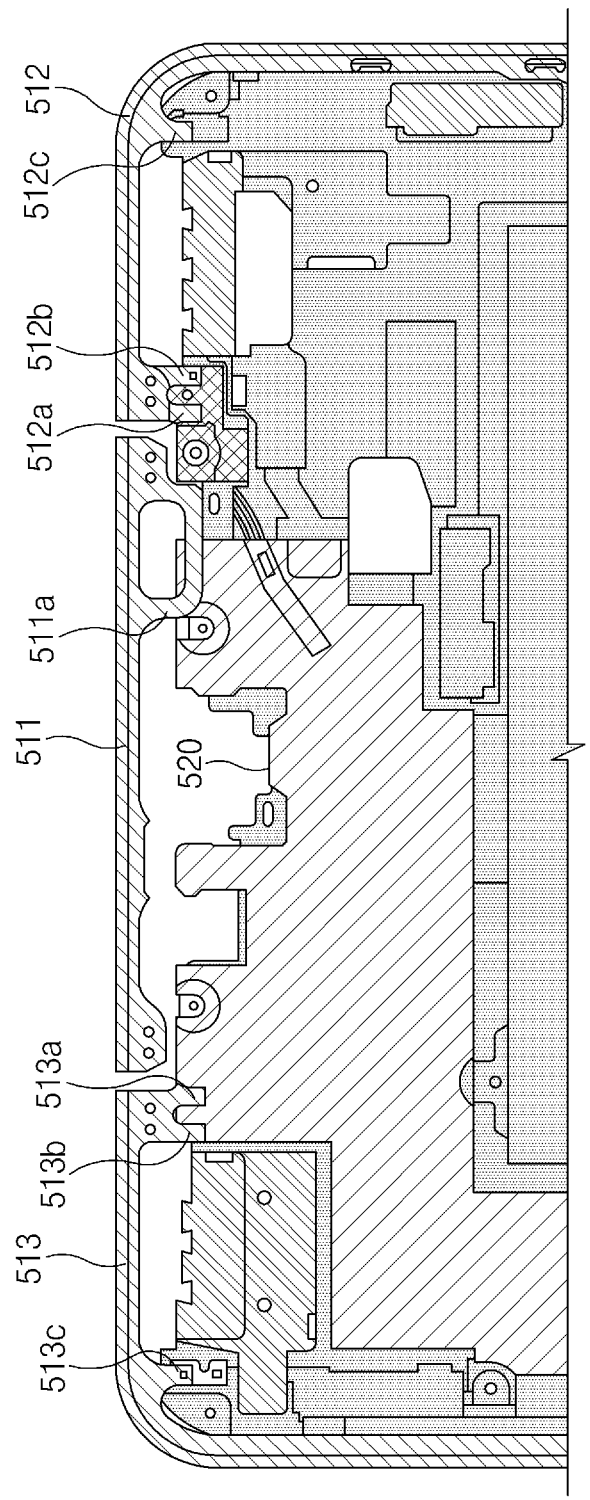
FIG. 7 illustrates a partial configuration of an electronic device according to an embodiment.

FIGS. 6A and 6B are schematic diagrams illustrating structures of antennas included in electronic devices according to various embodiments. FIG. 7 illustrates a partial configuration of an electronic device according to an embodiment.

Referring to FIGS. 6A and 7, an electronic device (e.g., the electronic device 101 of FIG. 1 or the electronic device 201 of FIG. 2) according to an embodiment may include the first conductive part 511, the second conductive part 512, the third conductive part 513, the printed circuit board 520, the feeding lines 541, 542, and 543, the ground lines 551, 552, and 553, and the ground layer 570.

According to an embodiment, the first conductive part 511 may be a portion of a side member (e.g., the side member 410 of FIG. 4) of the electronic device. For example, the first conductive part 511 may be an upper central portion of the side member of the electronic device. The first conductive part 511 may extend laterally across the central portion of the side member of the electronic device, as shown in FIG. 7. According to an embodiment, the first conductive part 511 may include a conductive loop 511*a*. The conductive loop 511*a* may protrude inwards toward a space hereinafter referred to as the inner space of the electronic device surrounded by the side member of the electronic device. The conductive loop 511*a* may be positioned adjacent to a non-conductive part interposed between the first conductive part 511 and the second conductive part 512. The conductive loop 511*a* may be electrically connected with the first feeding line 541, such that the conductive loop 511*a* is electrically connected with a communication circuit (e.g., the communication circuit 530 of FIG. 5) through the first feeding line 541. The first conductive part 511 may be used as an antenna radiator that supports a first band (e.g., about 0.8 GHz to about 1 GHz) while a portion of the second conductive part 512 may be used as an antenna radiator that supports a second band (e.g., about 1.7 GHz to about 2.2 GHz).

According to an embodiment, the second conductive part 512 may be a portion of the side member of the electronic device. For example, the second conductive part 512 may be an upper right portion of the side member of the electronic device. The second conductive part 512 may be physically spaced apart from the first conductive part 511, but may be disposed adjacent to the first conductive part 511. For example, the left end of the second conductive part 512 may be adjacent to the right end of the first conductive part 511, as shown in FIG. 7. The second conductive part 512 may be electrically coupled with the first conductive part 511. For example, the left end of the second conductive part 512 may be electrically coupled with the right end of the first conductive part 511. Another portion of the second conductive part 512 may be used as an antenna radiator that supports a third band (e.g., about 2.1 GHz to about 2.7 GHz). The third band may be different from the first band and the second band.

According to an embodiment, the second conductive part 512 may include a first conductive protrusion 512*a*, a second conductive protrusion 512*b*, and a third conductive protrusion 512*c*. The first conductive protrusion 512*a*, the second conductive protrusion 512*b*, and the third conductive protrusion 512*c* may protrude toward the inner space of the electronic device.

According to an embodiment, the first conductive protrusion 512*a* may be adjacent to the non-conductive part interposed between the first conductive part 511 and the second conductive part 512. For example, the first conductive protrusion 512*a* may protrude toward the inner space of the electronic device from one end of the second conductive part 512 that is adjacent to the first conductive part 511. In the example shown in FIG. 7, that end of the second conductive part 512 is the left end of the second conductive part 512. The first conductive protrusion 512*a* may be open, i.e. it does not connect to other elements of the electronic device. For example, the first conductive protrusion 512*a* may not be connected with the feeding lines or the ground lines. With the presence of the first conductive protrusion 512*a*, the area of the second conductive part 512 adjacent to the first conductive part 511 may be increased. Thus, coupling between the second conductive part 512 and the first conductive part 511 may be stronger.

According to an embodiment, the second conductive protrusion 512*b* may be positioned adjacent to the first conductive protrusion 512*a*. For example, the second conductive protrusion 512*b* may be further away from the first conductive part 511 than the first conductive protrusion 512*a*. The second conductive protrusion 512*b* may be electrically connected with the second feeding line 542. The second conductive protrusion 512*b* may be electrically connected with the second feeding line 542 through a matching circuit 590 that includes an electrical element such as a capacitor. The second conductive protrusion 512*b* may be electrically connected with the communication circuit through the matching circuit 590 and the second feeding line 542. The second conductive protrusion 512*b* may also be electrically connected with the first ground line 551 so as to be grounded through the first ground line 551.

According to an embodiment, the first conductive protrusion 512*a* may be positioned between the first conductive part 511 and the second conductive protrusion 512*b*. For example, the first conductive protrusion 512*a* may be positioned between the conductive loop 511*a* and the second conductive protrusion 512*b*. The first conductive protrusion 512*a* and the second conductive protrusion 512*b* may have substantially the same length extending from the second conductive part 512 toward the inner space of the electronic device. In this disclosure, the first conductive protrusion 512*a* and the second conductive protrusion 512*b* having "substantially the same length" indicates that their respective lengths are within 10% of one another.

According to an embodiment, the third conductive protrusion 512*c* may be further away from the first conductive protrusion 512*a* than the second conductive protrusion 512*b*. The third conductive protrusion 512*c* may be electrically connected with the second ground line 552 so as to be grounded through the second ground line 552.

According to an embodiment, the third conductive part 513 may be a portion of the side member of the electronic device. For example, the third conductive part 513 may be an upper left portion of the side member of the electronic device. The third conductive part 513 may be spaced apart from, but adjacent to, the first conductive part 511. For example, the right end of the third conductive part 513 may be adjacent to the left end of the first conductive part 511. The third conductive part 513 may be electrically coupled with the first conductive part 511. For example, the right end of the third conductive part 513 may be electrically coupled with the left end of the first conductive part 511. The third conductive part 513 may be used as an antenna radiator that supports the third band (e.g., about 2.1 GHz to about 2.7 GHz) and a portion of the first conductive part 511 may be used as an antenna radiator that supports a fourth band (e.g., about 1575 MHz).

According to an embodiment, the third conductive part 513 may include a fourth conductive protrusion 513*a*, a fifth conductive protrusion 513*b*, and a sixth conductive protrusion 513*c*. The fourth conductive protrusion 513*a*, the fifth conductive protrusion 513*b*, and the sixth conductive protrusion 513*c* may protrude toward the inner space of the electronic device.

According to an embodiment, the fourth conductive protrusion 513*a* may be adjacent to a non-conductive part interposed between the first conductive part 511 and the third conductive part 513. For example, the fourth conductive protrusion 513*a* may protrude toward the inner space of the electronic device from one end of the third conductive part 513 that is adjacent to the first conductive part 511. In the example shown in FIG. 7, that end of the third conductive part 513 is the right end of the third conductive part 513. The fourth conductive protrusion 513*a* may be open, i.e. it does not connect to other elements of the electronic device.

For example, the fourth conductive protrusion 513a may not be connected with the feeding lines or the ground lines.

According to an embodiment, the fifth conductive protrusion 513b may be positioned adjacent to the fourth conductive protrusion 513a. For example, the fifth conductive protrusion 513b may be further away from the first conductive part 511 than the fourth conductive protrusion 513a. The fifth conductive protrusion 513b may be electrically connected with the communication circuit through the third feeding line 543.

According to an embodiment, the fourth conductive protrusion 513a may be positioned between the first conductive part 511 and the fifth conductive protrusion 513b. The fourth conductive protrusion 513a and the fifth conductive protrusion 513b may have substantially the same length extending from the third conductive part 513 toward the inner space of the electronic device.

According to an embodiment, the sixth conductive protrusion 513c may be further away from the fourth conductive protrusion 513a than the fifth conductive protrusion 513b. The sixth conductive protrusion 513c may be electrically connected with the third ground line 553 so as to be grounded through the third ground line 553.

According to an embodiment, the conductive loop 511a, the second conductive protrusion 512b, the third conductive protrusion 512c, the fifth conductive protrusion 513b, and the sixth conductive protrusion 513c may be connected with the first feeding line 541, the second feeding line 542, the third feeding line 543, the first ground line 551, the second ground line 552, and the third ground line 553, respectively, through connecting members. A connecting member may be a conductive elastic member, such as a C-clip, a pin spring, a screw, or conductive foam.

According to an embodiment, the ground layer 570 may be spaced apart from the first conductive part 511, the second conductive part 512, and the third conductive part 513, but may be adjacent to a partial section of the first conductive part 511. For example, the ground layer 570 may be adjacent to a partial section of the first conductive part 511 that is adjacent to the third conductive part 513. The ground layer 570 may be positioned within a specified distance from the partial section of the first conductive part 511. The printed circuit board 520 may be arranged such that the ground layer 570 is adjacent to the partial section of the first conductive part 511. The ground layer 570 may not be connected with the first conductive part 511 but may be electrically coupled with the partial section of the first conductive part 511. For example, the ground layer 570 may be electrically coupled with the partial section of the first conductive part 511 that is adjacent to the third conductive part 513 so that capacitance is formed between the ground layer 570 and the adjacent section of the first conductive part 511. An effect similar to connecting the partial section of the first conductive part 511 and the ground layer 570 through a plurality of capacitors may be obtained by disposing the ground layer 570 near the partial section of the first conductive part 511. The ground layer 570 may disturb transmission of signals from the partial section of the first conductive part 511 to another section of the first conductive part 511 or the third conductive part 513.

Operations of each of the first to third conductive parts 511, 512, and 513 will be described below in detail with reference to FIGS. 13 and 16.

Referring to FIG. 6B, the printed circuit board 520 may include a ground layer 570a. A partial area A of the ground layer 570a may protrude toward the first conductive part 511. Thus, the partial area A of the ground layer 570a may be adjacent to a partial section of the first conductive part 511. For example, the partial area A of the ground layer 570a may be adjacent to the partial section of the first conductive part 511 that is adjacent to the third conductive part 513. The partial area A of the ground layer 570a may be positioned within a specified distance from the partial section of the first conductive part 511. According to an embodiment, the printed circuit board 520 may be arranged such that the partial area A of the ground layer 570a is adjacent to the partial section of the first conductive part 511.

According to an embodiment, the partial area A of the ground layer 570a may be electrically coupled with the partial section of the first conductive part 511. For example, the partial area A of the ground layer 570a may be electrically coupled with the partial section of the first conductive part 511 that is adjacent to the third conductive part 513 so that capacitance is formed between the partial area A of the ground layer 570a and the partial section of the first conductive part 511. An effect similar to connecting the partial section of the first conductive part 511 and the partial area A of the ground layer 570a through a plurality of capacitors may be obtained by disposing the ground layer 570a near the partial section of the first conductive part 511.

According to an embodiment, the first ground line 551, the second ground line 552, and the third ground line 553 may be electrically connected with the ground layer 570a.

Figure 8:
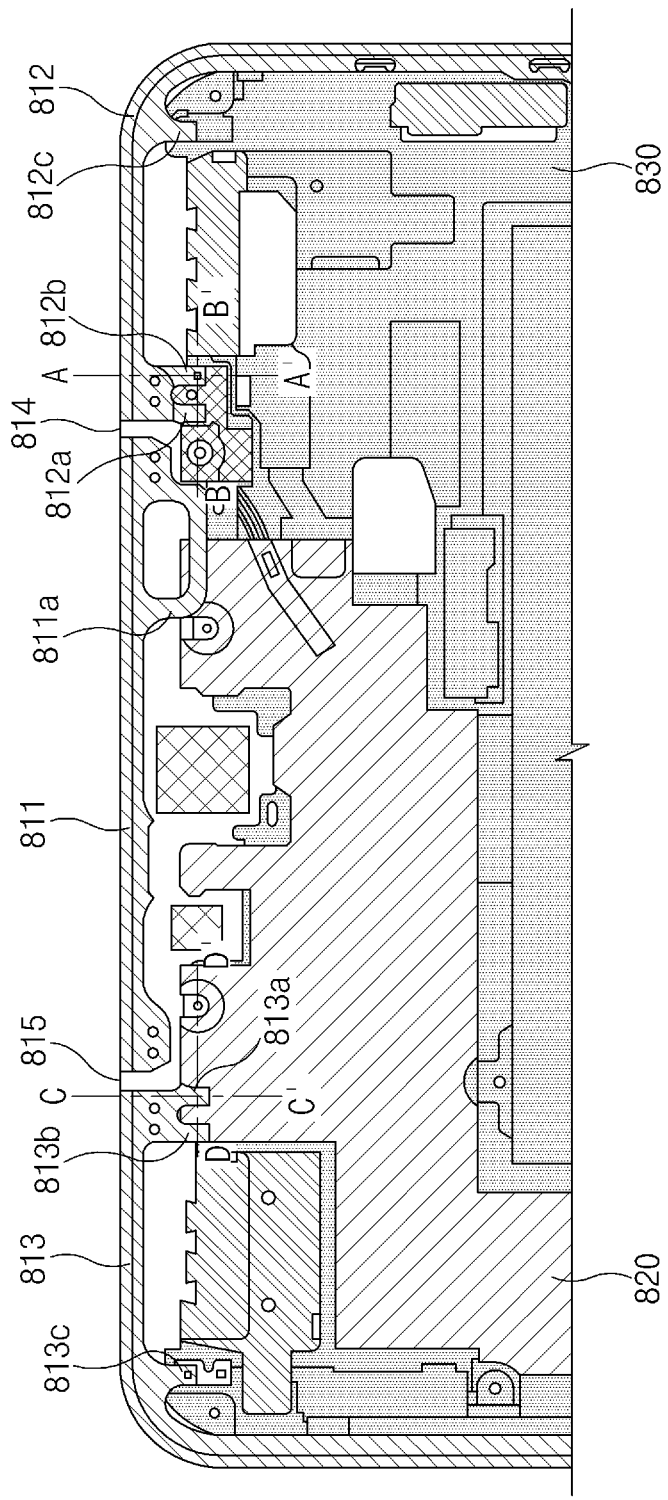
FIG. 8 illustrates a partial configuration of an electronic device according to an embodiment.
Figure 9:
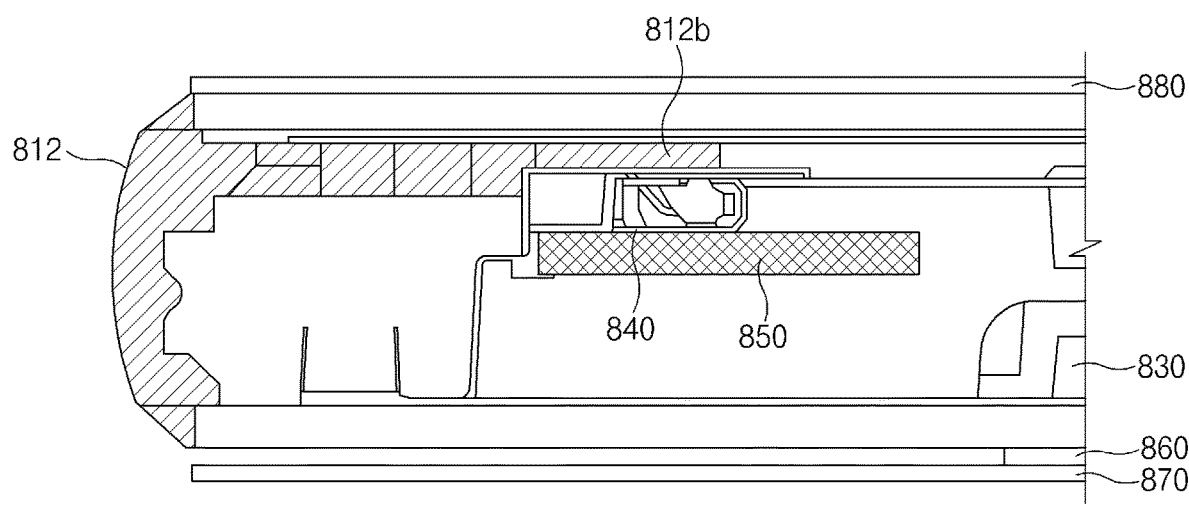
FIG. 9 is a sectional view taken along line A-A' of FIG. 8.
Figure 10:
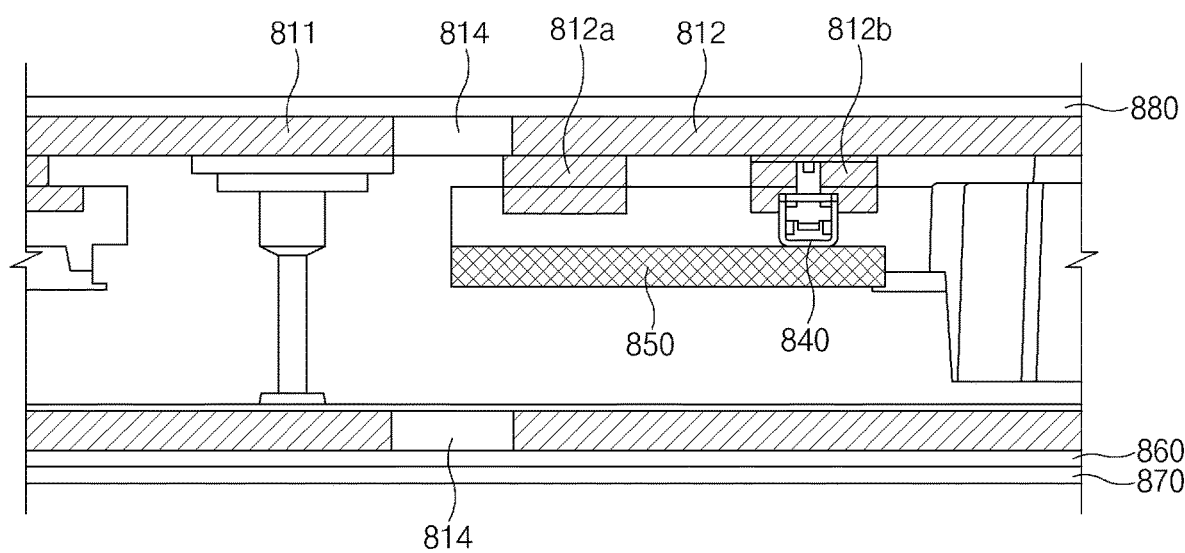
FIG. 10 is a sectional view taken along line B-B' of FIG. 8.
Figure 11:
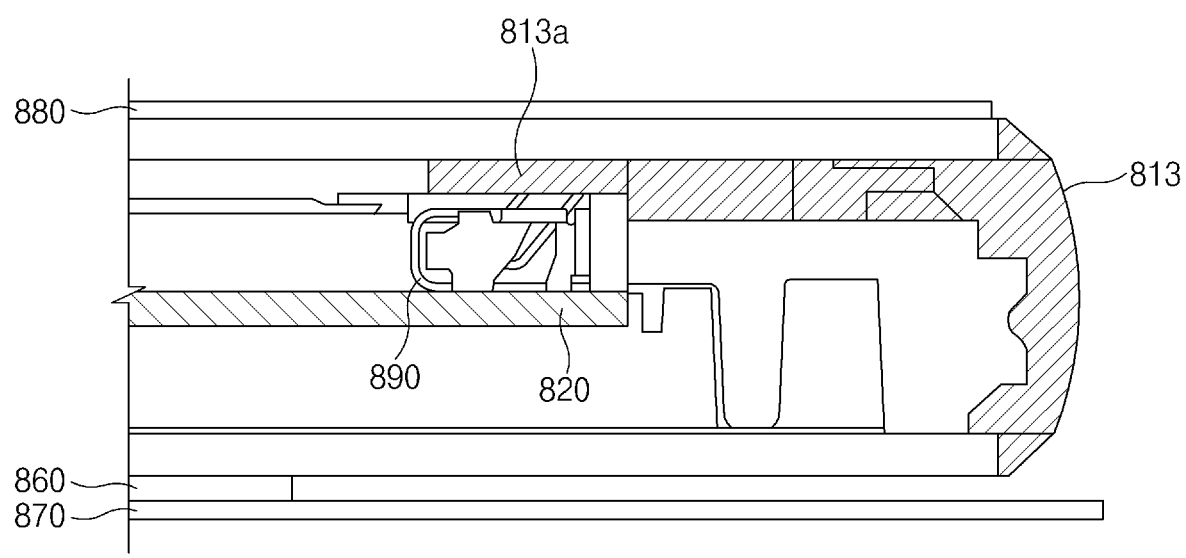
FIG. 11 is a sectional view taken along line C-C' of FIG. 8.
Figure 12:
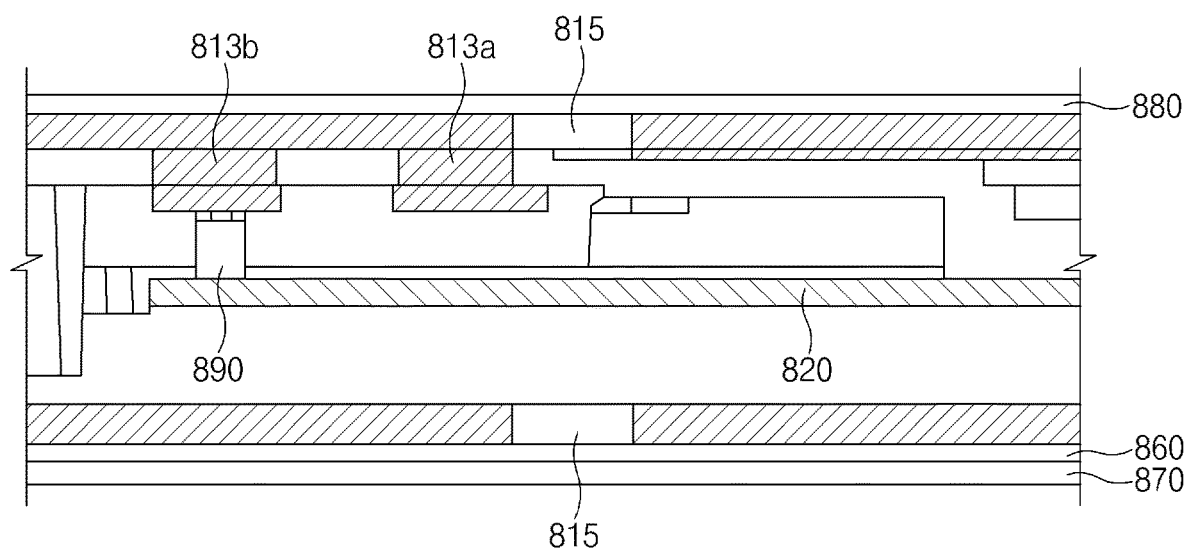
FIG. 12 is a sectional view taken along line D-D' of FIG. 8.

FIG. 8 illustrates a partial configuration of an electronic device according to an embodiment. FIG. 9 is a sectional view taken along line A-A' of FIG. 8. FIG. 10 is a sectional view taken along line B-B' of FIG. 8. FIG. 11 is a sectional view taken along line C-C' of FIG. 8. FIG. 12 is a sectional view taken along line D-D' of FIG. 8.

Referring to FIGS. 8 to 12, an electronic device (e.g., the electronic device 101 of FIG. 1 or the electronic device 102 of FIG. 2) according to an embodiment may include a first conductive part 811, a second conductive part 812, a third conductive part 813, a first non-conductive part 814, a second non-conductive part 815, a main printed circuit board 820, a support member 830, a first connecting member 840, a sub-printed circuit board 850, a display panel 860, a front cover glass 870, a rear cover glass 880, and a second connecting member 890.

According to an embodiment, the first conductive part 811 may include a conductive loop 811a. The second conductive part 812 may include a first conductive protrusion 812a, a second conductive protrusion 812b, and a third conductive protrusion 812c. The third conductive part 813 may include a fourth conductive protrusion 813a, a fifth conductive protrusion 813b, and a sixth conductive protrusion 813c. The first conductive part 811, the second conductive part 812, and the third conductive part 813 may have the same configuration as, or a configuration similar to, that of the first conductive part 511, the second conductive part 512, and the third conductive part 513 of FIG. 7, respectively.

According to an embodiment, the first non-conductive part 814 may make contact with the first conductive part 811 and the second conductive part 812. The first non-conductive part 814 may be interposed between the first conductive part 811 and the second conductive part 812. The first non-conductive part 814 may be made of, for example, an insulator.

According to an embodiment, the second non-conductive part 815 may make contact with the first conductive part 811 and the third conductive part 813. The second non-conductive part 815 may be interposed between the first conductive part 811 and the third conductive part 813. The second non-conductive part 815 may be made of, for example, an insulator.

According to an embodiment, the first connecting member 840 may be disposed on the sub-printed circuit board 850. The first connecting member 840 may make contact with the second conductive protrusion 812b. The first connecting member 840 may electrically connect the second conductive protrusion 812b and the sub-printed circuit board 850. The first connecting member 840 may be, for example, a C-clip. The sub-printed circuit board 850 may be electrically connected with the main printed circuit board 820. The second conductive protrusion 812b may receive electric power and be grounded through the first connecting member 840 and the sub-printed circuit board 850. One end of the first conductive protrusion 812a may be open i.e. it is not physically connected with other elements of the electronic device.

According to an embodiment, the second connecting member 890 may be disposed on the main printed circuit board 820. The second connecting member 890 may make contact with the fifth conductive protrusion 813b. The second connecting member 890 may electrically connect the fifth conductive protrusion 813b and the main printed circuit board 820. The second connecting member 890 may be, for example, a C-clip. The fifth conductive protrusion 813b may receive electric power through the second connecting member 890 and the main printed circuit board 820. According to an embodiment, one end of the fourth conductive protrusion 813a may be open, i.e. it is not physically connected with other elements of the electronic device.

The display panel 860 may be disposed between the support member 830 and the front cover glass 870. The front cover glass 870 may be disposed on a front side of the electronic device to cover the display panel 860. The display panel 860 may be exposed through the front cover glass 870. The rear cover glass 880 may cover a rear side of the electronic device.

Figure 13:
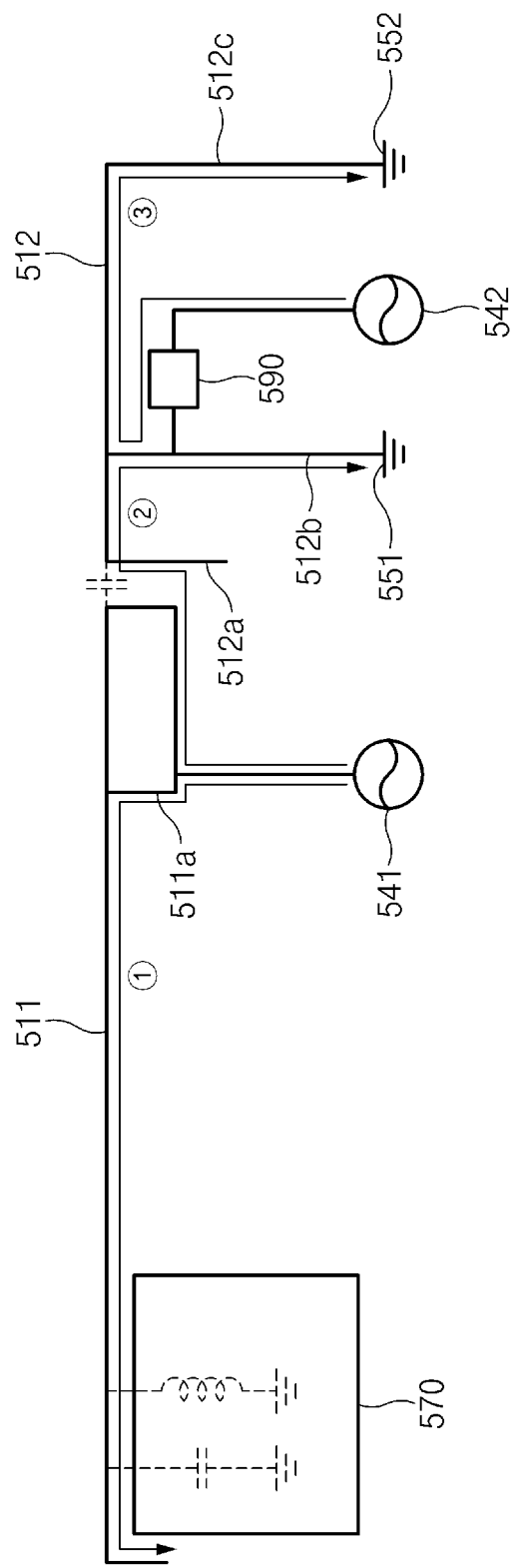
FIG. 13 is a schematic diagram illustrating signal transmission paths in antennas included in an electronic device according to an embodiment.

FIG. 13 is a schematic diagram illustrating signal transmission paths in antennas included in an electronic device according to an embodiment.

Referring to FIG. 13, an electronic device (e.g., the electronic device 101 of FIG. 1 or the electronic device 201 of FIG. 2) according to an embodiment may include the first conductive part 511, the second conductive part 512, and the ground layer 570.

According to an embodiment, at least a portion (indicated by the first electrical path ①) of the first conductive part 511 may radiate or receive signals in a first band. For example, radiation current may flow along the first electrical path ①, so that the first electrical path ① may radiate or receive signals in a low band (e.g., about 700 MHz to about 1000 MHz). In this case, the first conductive part 511 may be a monopole antenna. As explained above, the first conductive part 511 may be electrically coupled with the ground layer 570 so that capacitance and inductance may form between the first conductive part 511 and the ground layer 570. The capacitance and the inductance may function as a band pass filter or a band rejection filter.

According to an embodiment, at least a portion of the first conductive part 511, at least a portion of the second conductive part 512, and the second conductive protrusion 512b (indicated by the second electrical path ②) may radiate or receive signals in a second band. For example, the second electrical path ② may radiate or receive signals in a mid-band (e.g., about 1.7 GHz to about 2.2 GHz). The right end of the first conductive part 511 and the left end of the second conductive part 512 may be electrically coupled with each other. The right end of the first conductive part 511 and the left end of the second conductive part 512 may be more strongly coupled with each other due to the opened (i.e. open-circuit) first conductive protrusion 512a. For example, capacitance may be formed between the first conductive part 511 and the second conductive part 512, and due to the opened first conductive protrusion 512a, the magnitude of the capacitance may be further increased. Since the first conductive part 511 is electrically coupled with the second conductive part 512, radiation current may flow along the second electrical path ②. The mid-band signals may be transmitted from the first conductive part 511 to the second conductive part 512, or from the second conductive part 512 to the first conductive part 511. In other words, since the first conductive part 511 and the second conductive part 512 are electrically coupled with each other, the right portion of the first conductive part 511 and the left portion of the second conductive part 512 that correspond to the second electrical path ② may resonate in the mid-band.

According to an embodiment, the second conductive protrusion 512b, at least a portion of the second conductive part 512, and the third conductive protrusion 512c (indicated by the third electrical path ③) may radiate or receive signals in a third band. For example, the third electrical path ③ may radiate or receive signals in a high band (e.g., about 2.1 GHz to about 2.7 GHz). The ground line 551, which is connected with the second conductive protrusion 512b, may separate the flow of radiation current in the second electrical path ② and the third electrical path ③. As such, the ground line 551 may separate mid-band signals and high-band signals in the second conductive part 512. The distance between the second conductive protrusion 512b and the third conductive protrusion 512c may range, for example, from about 25 mm to about 30 mm.

According to an embodiment, the second conductive part 512 may also resonate in the low band. For example, when viewed from the ground line 551, the first conductive part 511 may function as a parasitic element of the second conductive part 512 due to the coupling of the second conductive part 512 and the first conductive part 511. In this case, the second conductive part 512 may resonate in the low band due to being electrically coupled to the first conductive part 511.

Figure 14:
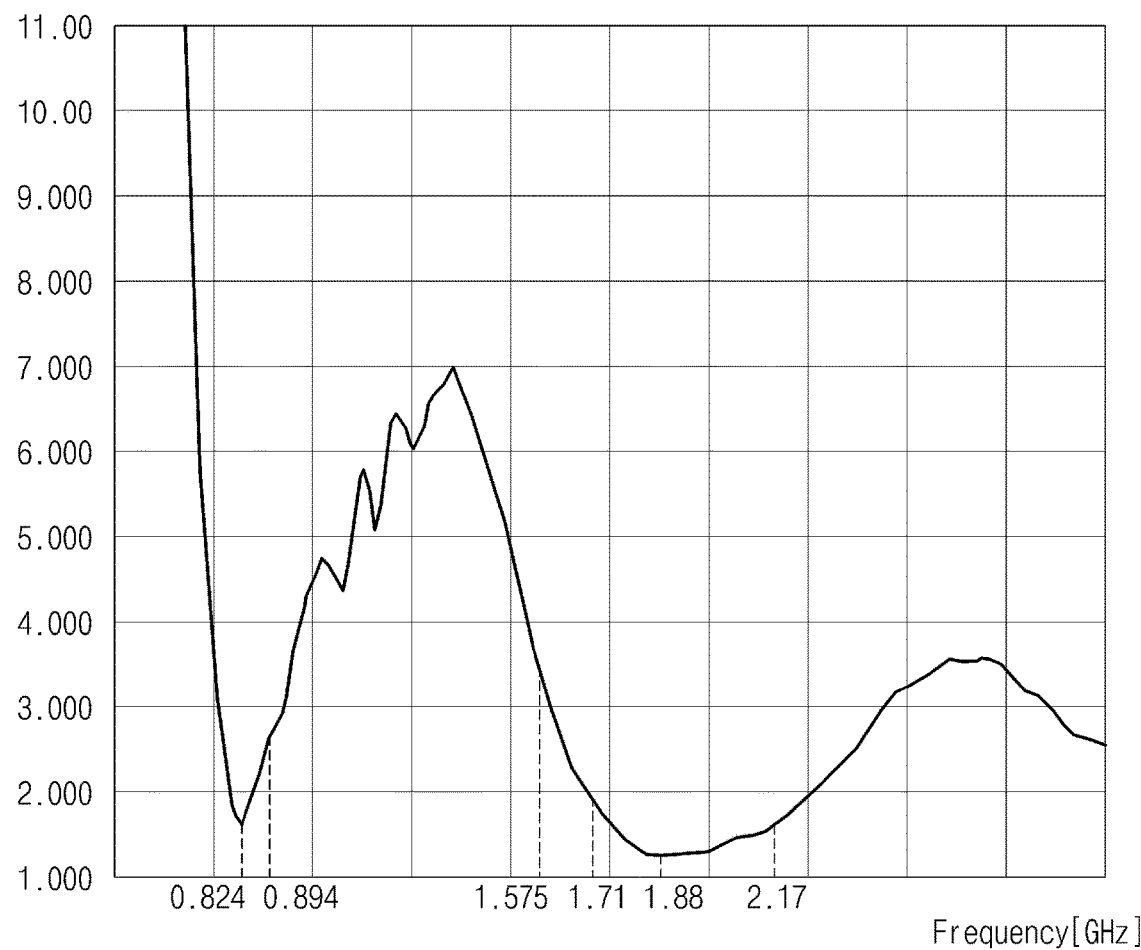
FIG. 14 is a graph depicting frequency dependent reflection coefficients of an antenna included in an electronic device according to an embodiment.

FIG. 14 is a graph depicting frequency dependent reflection coefficients of an antenna included in an electronic device according to an embodiment.

The graph illustrated in FIG. 14 depicts frequency dependent reflection coefficients of the first conductive part 511 of FIG. 13. The frequency band supported by the first conductive part 511 may be identified through the graph illustrated in FIG. 14.

Referring to FIG. 14, the first conductive part 511 has low reflection coefficients in the frequency band of 0.824 GHz to 0.894 GHz. Efficiency of the first conductive part 511 in this low band may be enhanced by employing the ground layer 570, which is disposed adjacent to the first conductive part 511, for resonance in the low band, as described above with reference to FIG. 13. The first conductive part 511 has low reflection coefficients in the frequency band of 1.71 GHz to 2.17 GHz. Efficiency of the first conductive part 511 in this mid-band may be enhanced by employing the first conductive protrusion 512a, which is positioned at the distal end of the second conductive part 512 adjacent to the first conductive part 511, for resonance in the mid-band, as described above with reference to FIG. 13.

Figure 15:
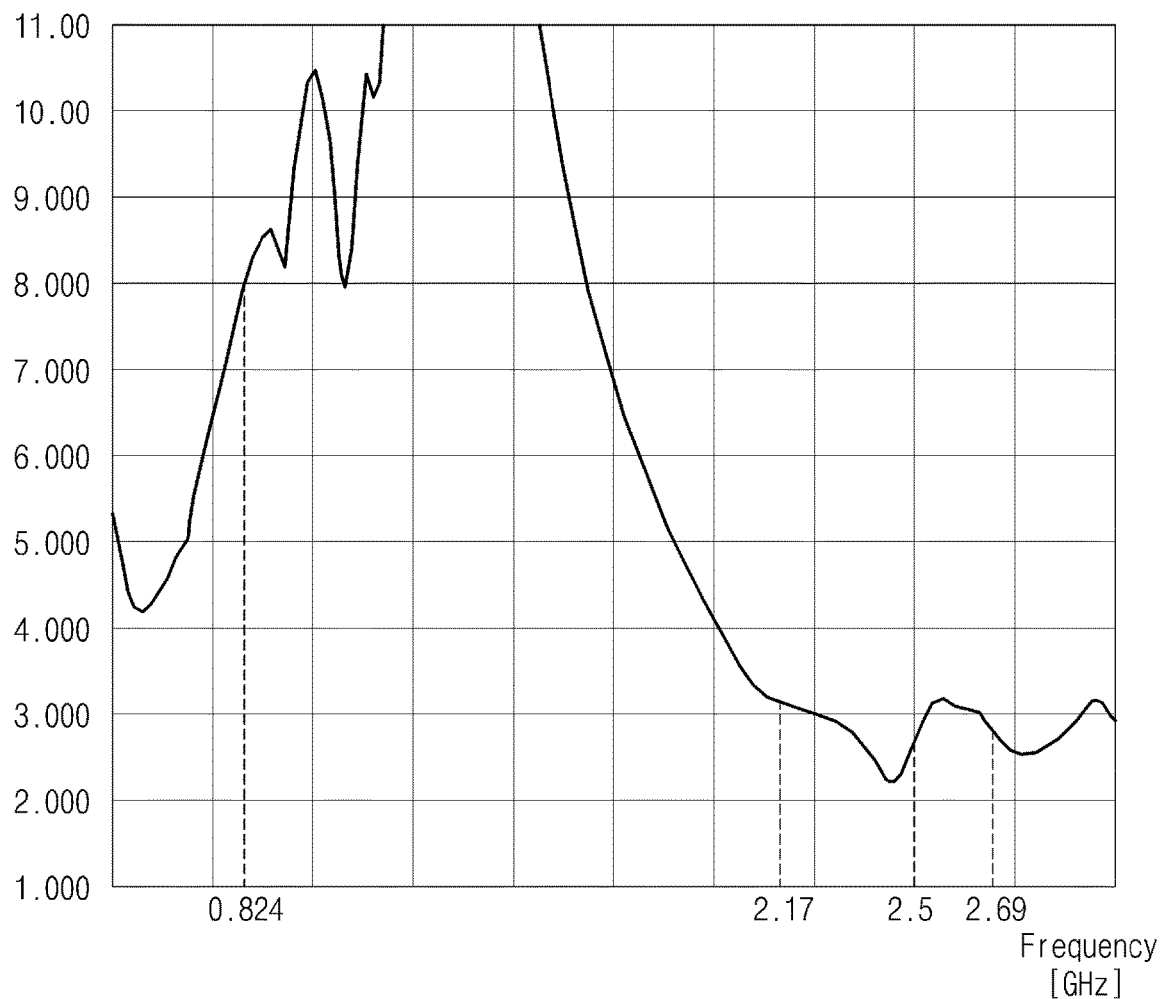
FIG. 15 is a graph depicting frequency dependent reflection coefficients of an antenna included in an electronic device according to an embodiment.

FIG. 15 is a graph depicting frequency dependent reflection coefficients of an antenna included in an electronic device according to an embodiment.

The graph illustrated in FIG. 15 depicts frequency dependent reflection coefficients of the second conductive part 512 of FIG. 13. The frequency band supported by the second conductive part 512 may be identified through the graph illustrated in FIG. 15.

Referring to FIG. 15, the second conductive part 512 has low reflection coefficients in the frequency band of 2.17 GHz to 2.69 GHz. The second conductive part 512 may resonate in this high band, as described above with reference to FIG. 13. Efficiency of the second conductive part 512 in this high band may be enhanced by separating mid-band signals and high-band signals by using the first ground line 551 and designing the first conductive part 511 and the second conductive part 512 to support different frequency bands.

The second conductive part 512 has low reflection coefficients in a frequency band of 0.824 GHz or lower. This is due to a portion of the second conductive part 512 that resonates together with a portion of the first conductive part 511 in the low band, as described above with reference to FIG. 13.

Figure 16:
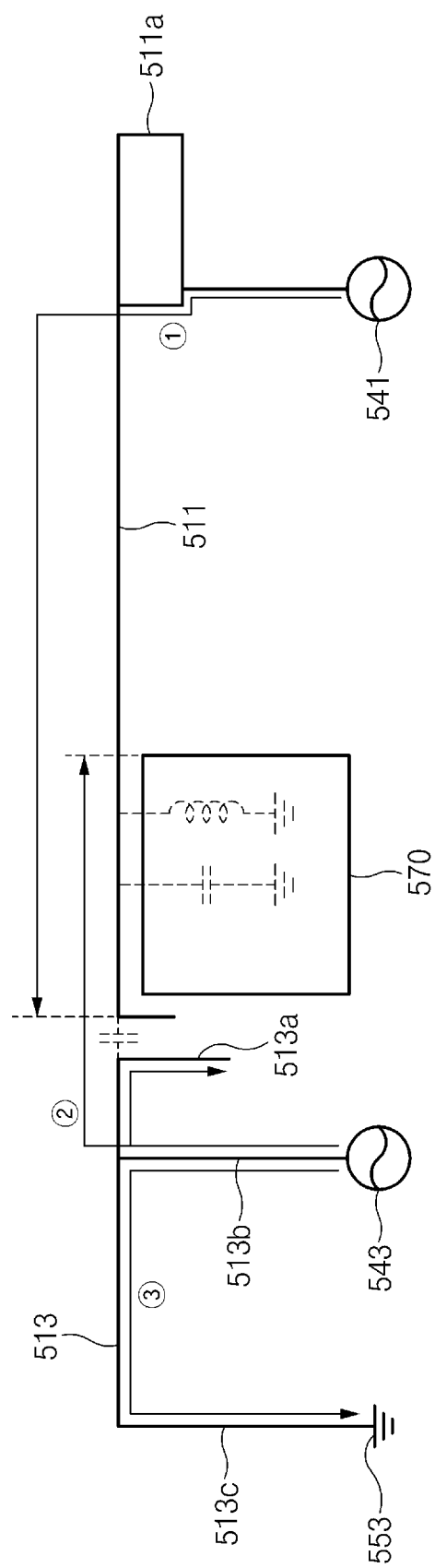
FIG. 16 is a schematic diagram illustrating signal transmission paths in antennas included in an electronic device according to an embodiment.

FIG. 16 is a schematic diagram illustrating signal transmission paths in antennas included in an electronic device according to an embodiment.

Referring to FIG. 16, an electronic device (e.g., the electronic device 101 of FIG. 1 or the electronic device 201 of FIG. 2) according to an embodiment may include the first conductive part 511, the third conductive part 513, and the ground layer 570.

According to an embodiment, the ground layer 570 may be disposed to block signals from being transmitted from the first conductive part 511 to the third conductive part 513. At least a portion (indicated by the first electrical path ①) of the first conductive part 511 may radiate or receive signals in a first band. For example, the first electrical path ① may radiate or receive low-band signals. The first conductive part 511 may be electrically coupled with the ground layer 570. Capacitance and inductance may form between the first conductive part 511 and the ground layer 570. The capacitance and the inductance may function as a band pass filter or a band rejection filter. Therefore, due to the electrical coupling between the ground layer 570 and the first conductive part 511, low-band signals flowing through the first electrical path ① may be blocked so that they are not transmitted to the third conductive part 513. Accordingly, the first conductive part 511 may be electrically isolated from the third conductive part 513 by the ground layer 570.

Likewise, according to an embodiment, the ground layer 570 may prevent signals transmitted from the third conductive part 513 to a partial section of the first conductive part 511 from being further transmitted to the remaining section of the first conductive part 511. At least a portion of the third conductive part 513 and a partial section of the first conductive part 511 (indicated by the second electrical path ②) may receive signals in a fourth band. For example, the second electrical path ② may receive GPS signals.

According to an embodiment, the GPS signals may flow from the fifth conductive protrusion 513b to the fourth conductive protrusion 513a, or from the fourth conductive protrusion 513a to the fifth conductive protrusion 513b. The opened fourth conductive protrusion 513a may be electrically coupled with the first conductive part 511. Accordingly, the opened fourth conductive protrusion 513a and the first conductive part 511 exhibit an effect similar to if the fourth conductive protrusion 513a and the first conductive part 511 were connected through a capacitor. Capacitance may be formed between the first conductive part 511 and the third conductive part 513, and due to the opened fourth conductive protrusion 513a, the magnitude of the capacitance may be further increased.

Due to the electrical coupling between the ground layer 570 and the first conductive part 511, the GPS signals flowing through the second electrical path ② may not be transmitted to the remaining section of the first conductive part 511. For example, the ground layer 570 may block the GPS signals from being transmitted from the partial section of the first conductive part 511 to the remaining section of the first conductive part 511. The band pass filter or the band rejection filter formed by the coupling of the first conductive part 511 and the ground layer 570 may block the GPS signals from being transmitted from the partial section of the first conductive part 511 to the remaining section of the first conductive part 511. Functioning as the band pass filter or the band rejection filter, the GPS signals may be separated from mid-band signals by the ground layer 570.

According to an embodiment, the fifth conductive protrusion 513b, at least a portion of the third conductive part 513, and the sixth conductive protrusion 513c (indicated by the third electrical path ③) may receive signals in a third band, e.g. a high band. The distance between the fifth conductive protrusion 513b and the sixth conductive protrusion 513c may range, for example, from about 25 mm to about 30 mm.

Figure 17:
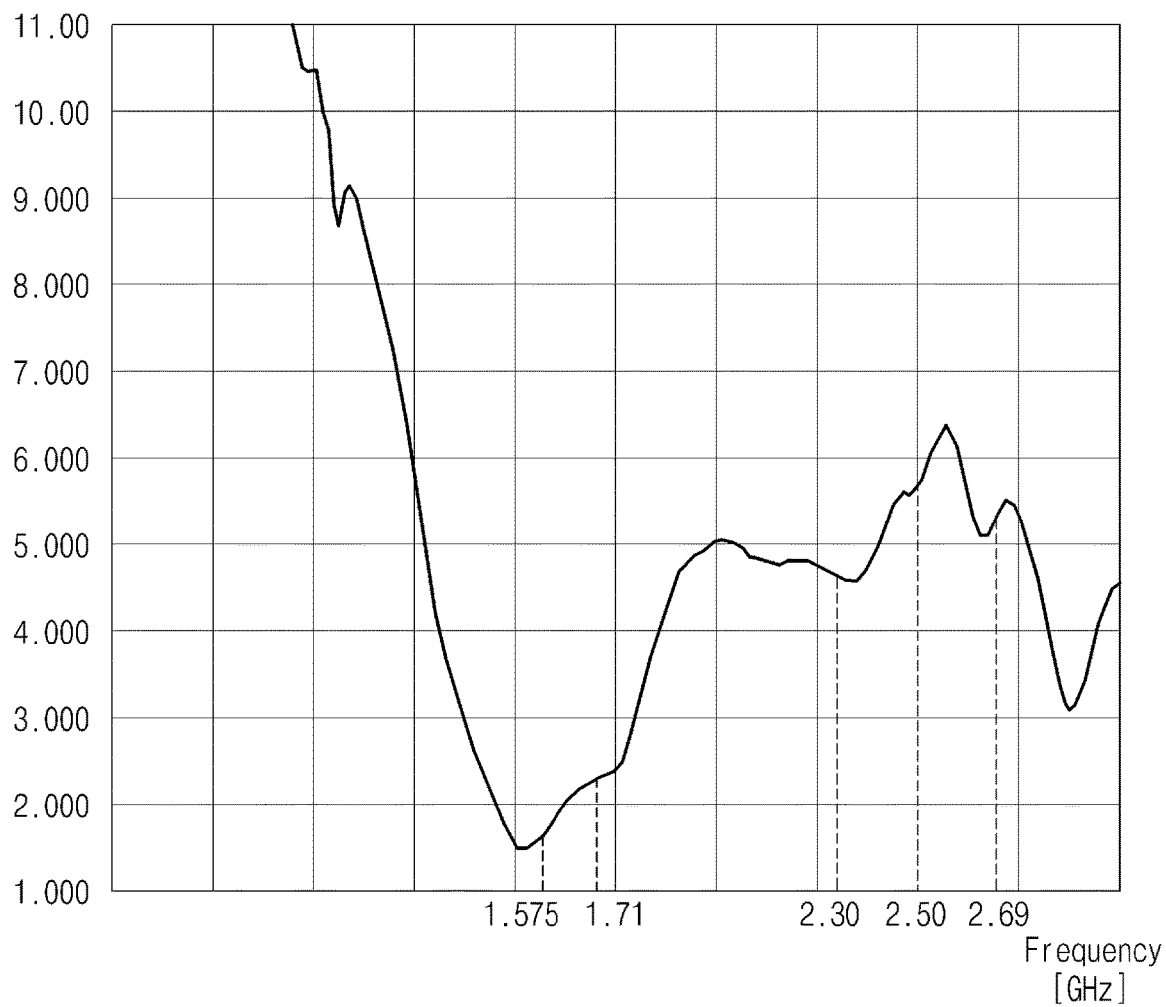
FIG. 17 is a graph depicting frequency dependent reflection coefficients of an antenna included in an electronic device according to an embodiment.

FIG. 17 is a graph depicting frequency dependent reflection coefficients of an antenna included in an electronic device according to an embodiment.

The graph illustrated in FIG. 17 depicts frequency dependent reflection coefficients of the third conductive part 513 of FIG. 16. The frequency band supported by the third conductive part 513 may be identified through the graph illustrated in FIG. 17.

Referring to FIG. 17, the third conductive part 513 has low reflection coefficients in the frequency band of 1.575 GHz to 1.71 GHz. Efficiency of the third conductive part 513 in this GPS band may be enhanced by employing the ground layer 570, which is disposed adjacent to the first conductive part 511, and the opened fourth conductive protrusion 513a for resonance in the GPS band, as described above with reference to FIG. 16. The third conductive part 513 has low reflection coefficients in the frequency band of 2.30 GHz to 2.50 GHz. This performance of the third conductive part 513 in this high band is due to the configuration of the third conductive part 513 as described above with reference to FIG. 16.

Figure 18A:
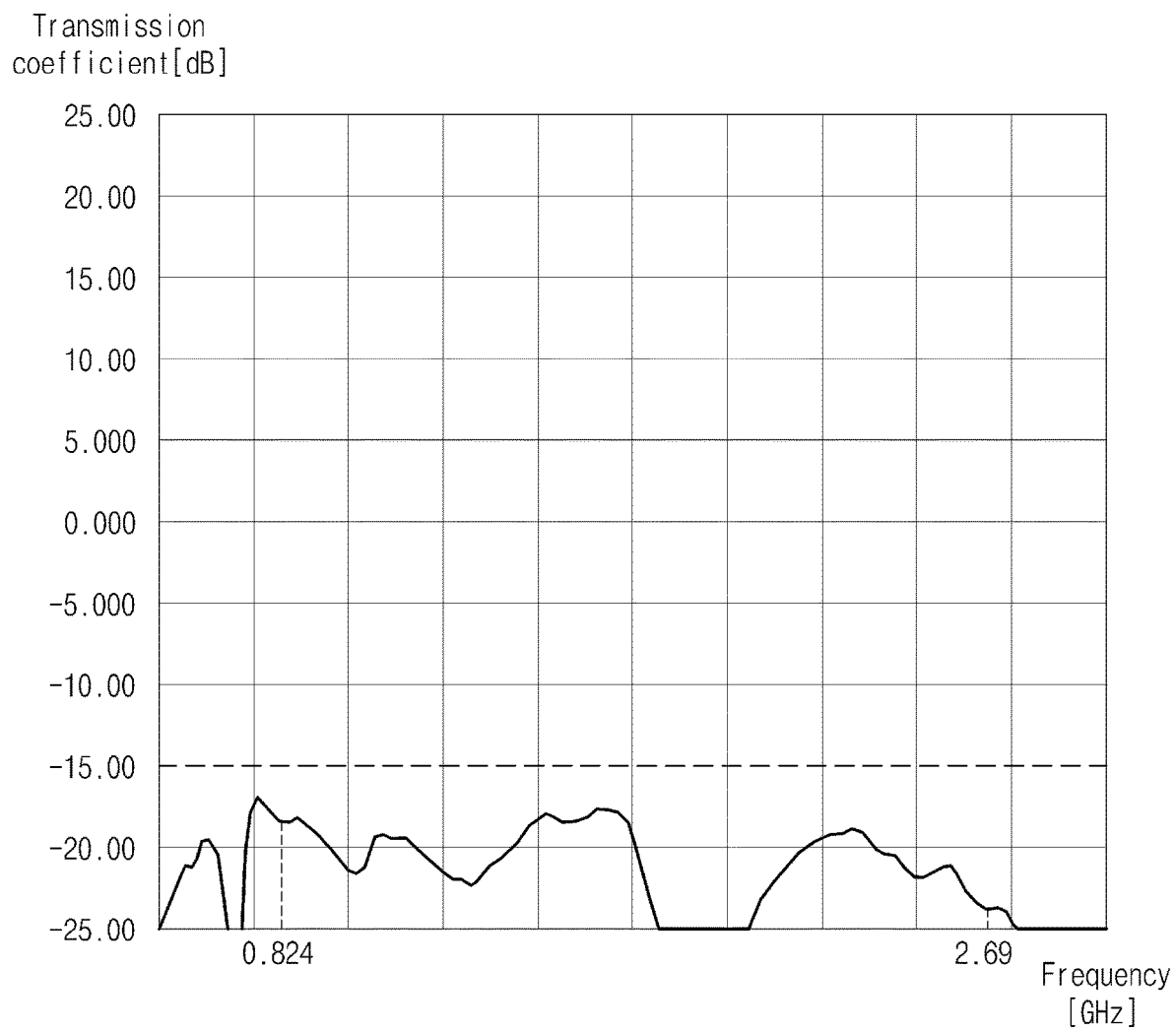
FIG. 18A and FIG. 18B are graphs depicting frequency dependent transmission coefficients of an antenna included in an electronic device according to an embodiment.
Figure 18B:
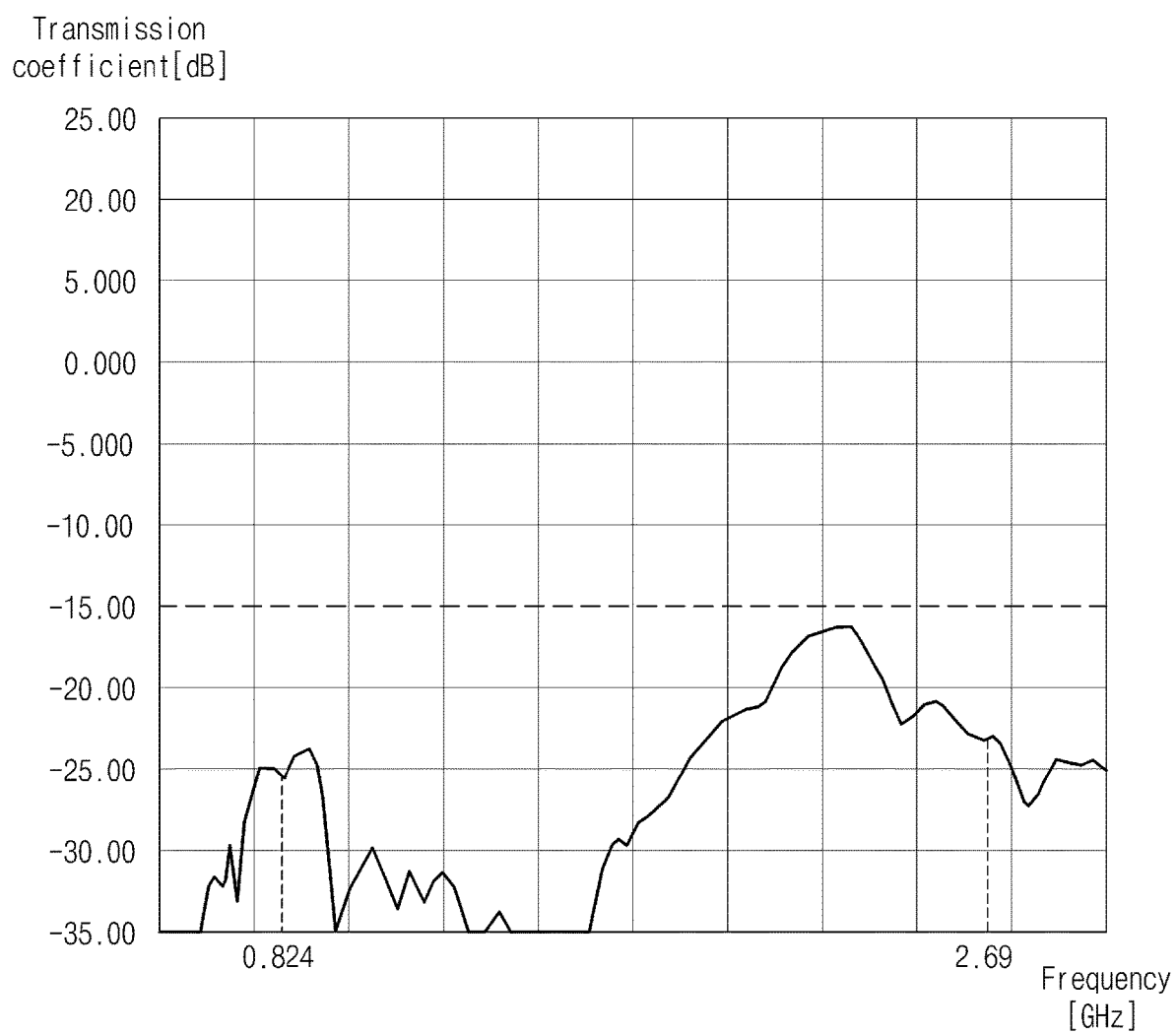

FIGS. 18A and 18B are graphs depicting frequency dependent transmission coefficients of an antenna included in an electronic device according to an embodiment.

FIG. 18A illustrates frequency dependent transmission coefficients between the first conductive part 511 and the third conductive part 513, and FIG. 18B illustrates frequency dependent transmission coefficients between the first conductive part 511 and the second conductive part 512.

Referring to FIGS. 18A and 18B, the transmission coefficients between the first conductive part 511 and the third conductive part 513 and the transmission coefficients between the first conductive part 511 and the second conductive part 512 are less than or equal to −15 dB for the entire frequency band shown in the figures. When transmission coefficients are less than or equal to −15 dB, this means that two antenna radiators are electrically isolated from each other. Through the graphs of FIGS. 18A and 18B, it can be confirmed that the first conductive part 511 is sufficiently isolated from the second conductive part 512 and the third conductive part 513, as described above with reference to FIGS. 13 and 16.

Figure 18C:
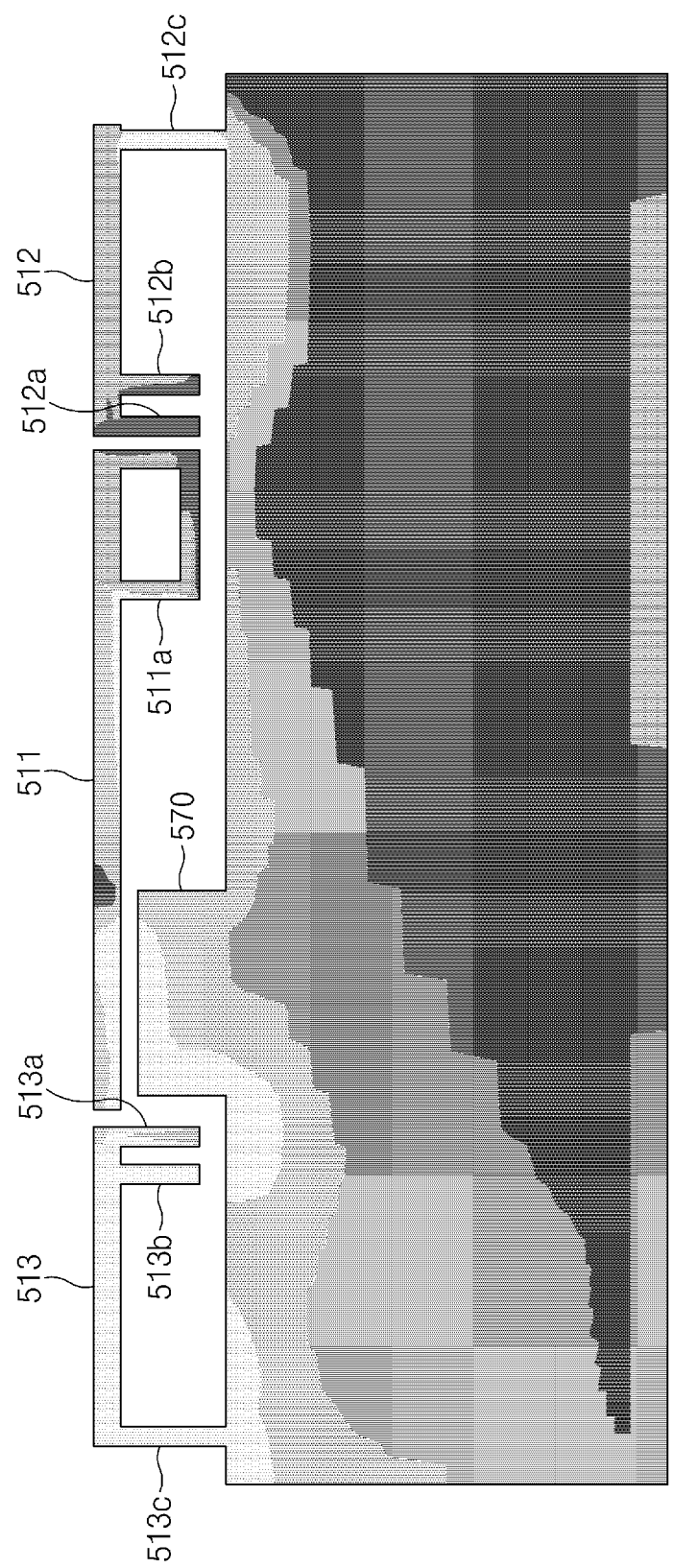
FIG. 18C illustrates position dependent efficiency of an antenna included in an electronic device according to an embodiment.

FIG. 18C illustrates position dependent efficiency of an antenna included in an electronic device according to an embodiment. FIG. 18C illustrates a simulation result for predicting efficiency of the antenna included in the electronic device illustrated in FIG. 6A.

Referring to FIG. 18C, the third conductive part 513, a partial section of the first conductive part 511, and a partial area of the ground layer 570 have high efficiency. Specifically, a partial section of the first conductive part 511 that is adjacent to the ground layer 570 and a partial area of the ground layer 570 that is adjacent to the first conductive part 511 have high efficiency. Meanwhile, the remaining section of the first conductive part 511 has low efficiency. Through the simulation result of FIG. 18C, it can be confirmed that signals in a band supported by the third conductive part 513, due to the arrangement of the ground layer 570 as described above with reference to FIG. 16, may be transmitted to the partial section of the first conductive part 511, but are not further transmitted to the remaining section of the first conductive part 511.

Figure 19:
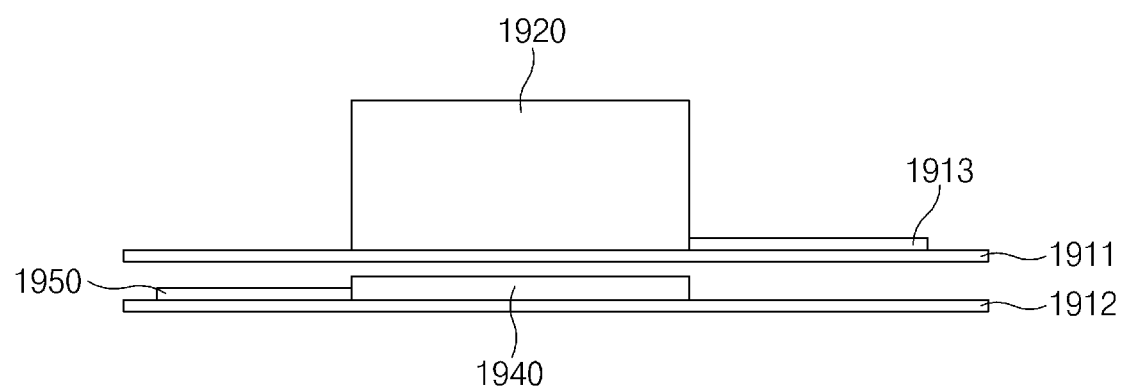
FIG. 19 is a block diagram for schematically illustrating a portion of a printed circuit board and a connecting member included in an electronic device according to an embodiment.
Figure 20:
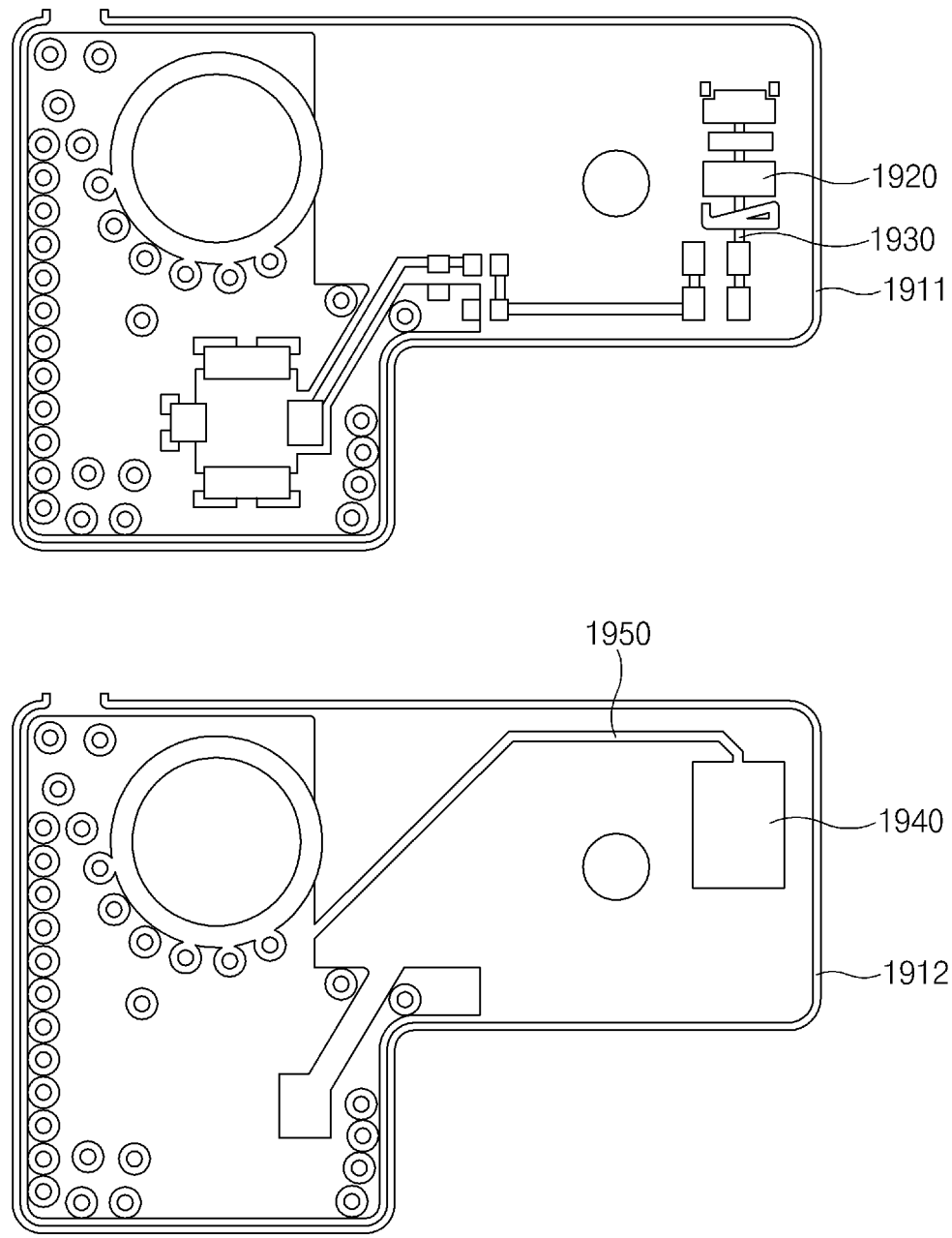
FIG. 20 are schematic diagrams illustrating a portion of a printed circuit board and a connecting member included in an electronic device according to an embodiment.

FIG. 19 is a block diagram for schematically illustrating a portion of a printed circuit board and a connecting member included in an electronic device according to an embodiment. FIG. 20 are schematic diagrams illustrating a portion of the printed circuit board and the connecting member included in the electronic device according to an embodiment.

Referring to FIGS. 19 and 20, an electronic device (e.g., the electronic device 101 of FIG. 1 or the electronic device 201 of FIG. 2) according to an embodiment may further include a connecting member 1920 electrically connected with a conductive protrusion (not shown in FIGS. 19 and 20), a feeding line 1930 electrically connecting a communication circuit with the connecting member 1920, a conductive pad 1940 spaced apart from and electrically coupled with the connecting member 1920, and a ground line 1950 electrically connected with the conductive pad 1940.

According to an embodiment, a printed circuit board (e.g., the sub-printed circuit board 850 of FIG. 9) may at least include a first layer 1911 and a second layer 1912. The first layer 1911 may be, for example, a top layer of the printed circuit board, and the second layer 1912 may be a layer disposed below the first layer 1911. The printed circuit board may also include three or more layers.

According to an embodiment, the connecting member 1920 may be disposed on the first layer 1911. The connecting member 1920 may be electrically connected with a conductive protrusion (e.g., the second conductive protrusion 812b of FIG. 9). The connecting member 1920 may be, for example, a C-clip. The connecting member 1920 may be electrically connected with the feeding line 1930 disposed on the first layer 1911. The conductive protrusion may be electrically connected with the feeding line 1930 through the connecting member 1920 and may be in turn be electrically connected with the communication circuit (e.g., the communication circuit 530 of FIG. 5) through the connecting member 1920 and the feeding line 1930.

According to an embodiment, the conductive pad 1940 may be disposed on the second layer 1912. As shown in the top view of FIG. 20, the conductive pad 1940 may be disposed to overlap the connecting member 1920. The conductive pad 1940 may be electrically connected with the ground line 1950 disposed on the second layer 1912. The conductive pad 1940 may be grounded through the ground line 1950.

According to an embodiment, the conductive pad 1940 may be electrically coupled with the connecting member 1920. Accordingly, the conductive protrusion may be grounded by the coupling. Radiation efficiency and bandwidth performance of the antenna may be improved by employing the conductive pad 1940 in grounding the conductive protrusion.

Figure 21:
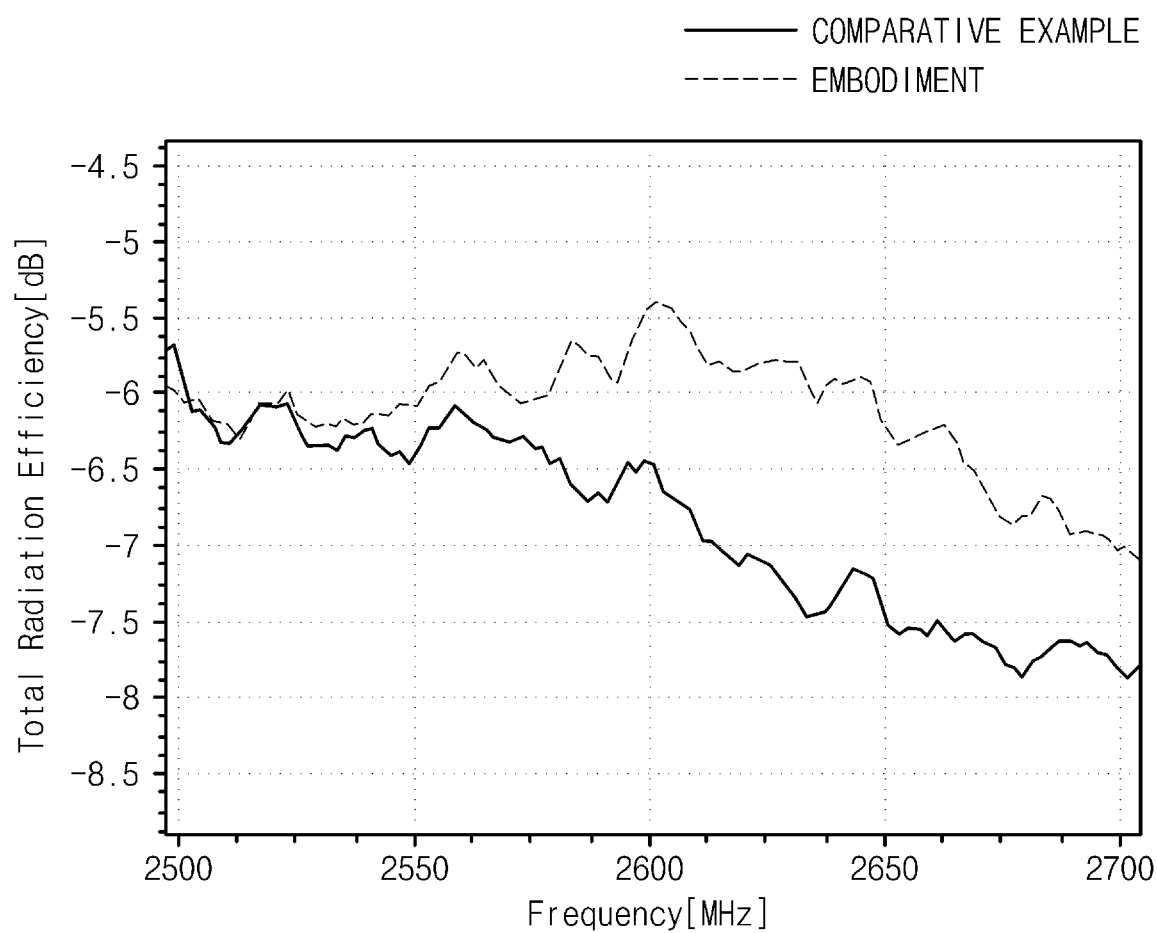
FIG. 21 is a graph depicting frequency dependent total radiation efficiency of an antenna included in an electronic device according to an embodiment.

FIG. 21 is a graph depicting frequency dependent total radiation efficiency of an antenna included in an electronic device according to an embodiment. The graph of FIG. 21 depicts total radiation efficiency of the second conductive part 512, which supports the high band (e.g., about 2.1 GHz to about 2.7 GHz).

Referring to FIG. 21, an electronic device (e.g., the electronic device 101 of FIG. 1 or the electronic device 201 of FIG. 2) according to an embodiment may include the conductive pad 1940 coupled with the connecting member 1920 and the ground line 1950, which are illustrated in FIGS. 19 and 20. In a different embodiment, an electronic device may include the ground line 551 directly connected with the second conductive protrusion 512b, as illustrated in FIG. 5.

As illustrated in FIG. 21, total radiation efficiency of a comparative conventional antenna may be decreased in band of 2055 GHz or higher. In contrast, in the band of 2.55 GHz or higher, total radiation efficiency of the antenna may be higher as compared to the comparative conventional antenna. Thus, the bandwidth of the antenna of the electronic device according to an embodiment of the present disclosure may be wider than that of a conventional antenna. Through FIG. 21, it can be confirmed that, by employing the conductive pad 1940 coupled with the connecting member 1920, the radiation efficiency and bandwidth performance of the antenna according to the present disclosure are improved.

Figure 22:
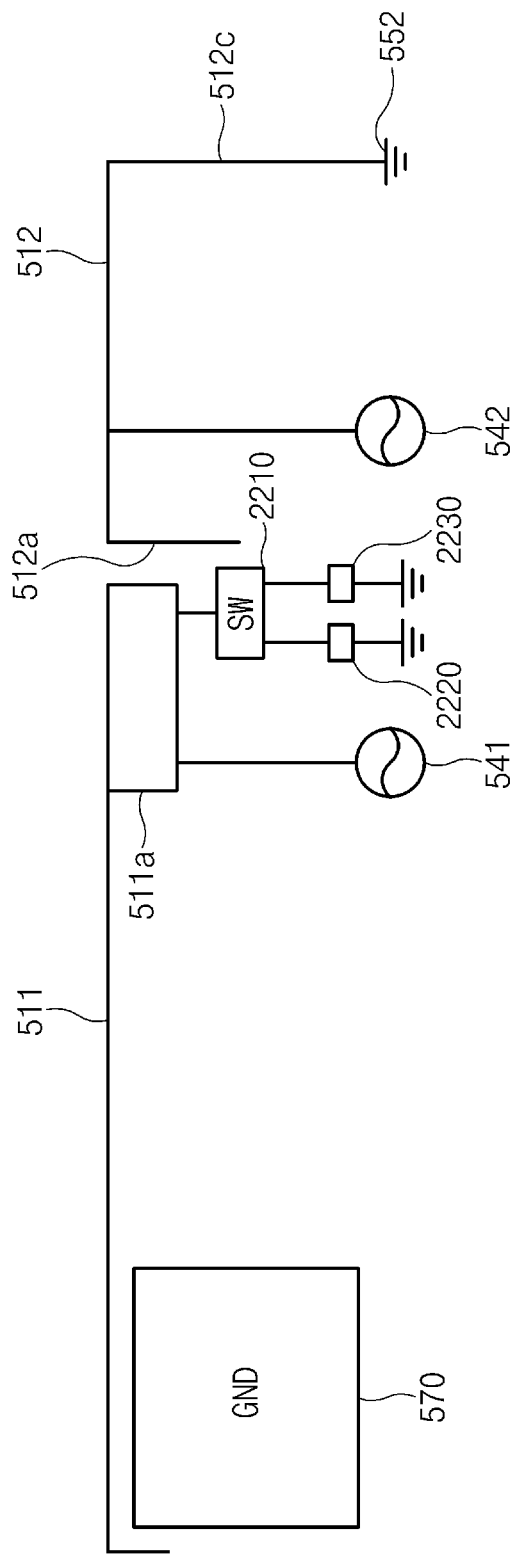
FIG. 22 is a schematic diagram illustrating a structure of an antenna included in an electronic device according to an embodiment.

FIG. 22 is a schematic diagram illustrating a structure of an antenna included in an electronic device according to an embodiment.

As illustrated in FIG. 22, an electronic device (e.g., the electronic device 101 of FIG. 1 or the electronic device 201 of FIG. 2) according to an embodiment may further include a first element 2220, a second element 2230 having different impedance from the first element 2220, and a switch 2210 selectively connecting the first conductive part 511 with the first element 2220 or the second element 2230. In FIG. 22, the first element 2220 and the second elements 2230 are illustrated as lumped elements.

The switch 2210 may be electrically connected with the conductive loop 511a of the first conductive part 511. The switch 2210 may be electrically connected with the first element 2220 and the second element 2230. The switch 2210 may selectively connect the conductive loop 511a with the first element 2220 or the second element 2230. The switch 2210 may be controlled by, for example, the communication circuit 530 or the processor 560 illustrated in FIG. 5. The first element 2220 may include, for example, a capacitor. Capacitance of the first element 2220 may be, for example, about 0.5 pF. The second element 2230 may include, for example, an inductor. Inductance of the second element 2230 may be, for example, about 1.8 nH. Since the second conductive part 512 is coupled with the first conductive part 511, an element (e.g. capacitor or inductor) connected with the conductive loop 511a may have an influence on the resonance of the second conductive part 512. Thus, the electronic device according to an embodiment may adjust the resonant frequency of the second conductive part 512 by controlling the switch 2210.

Figure 23:
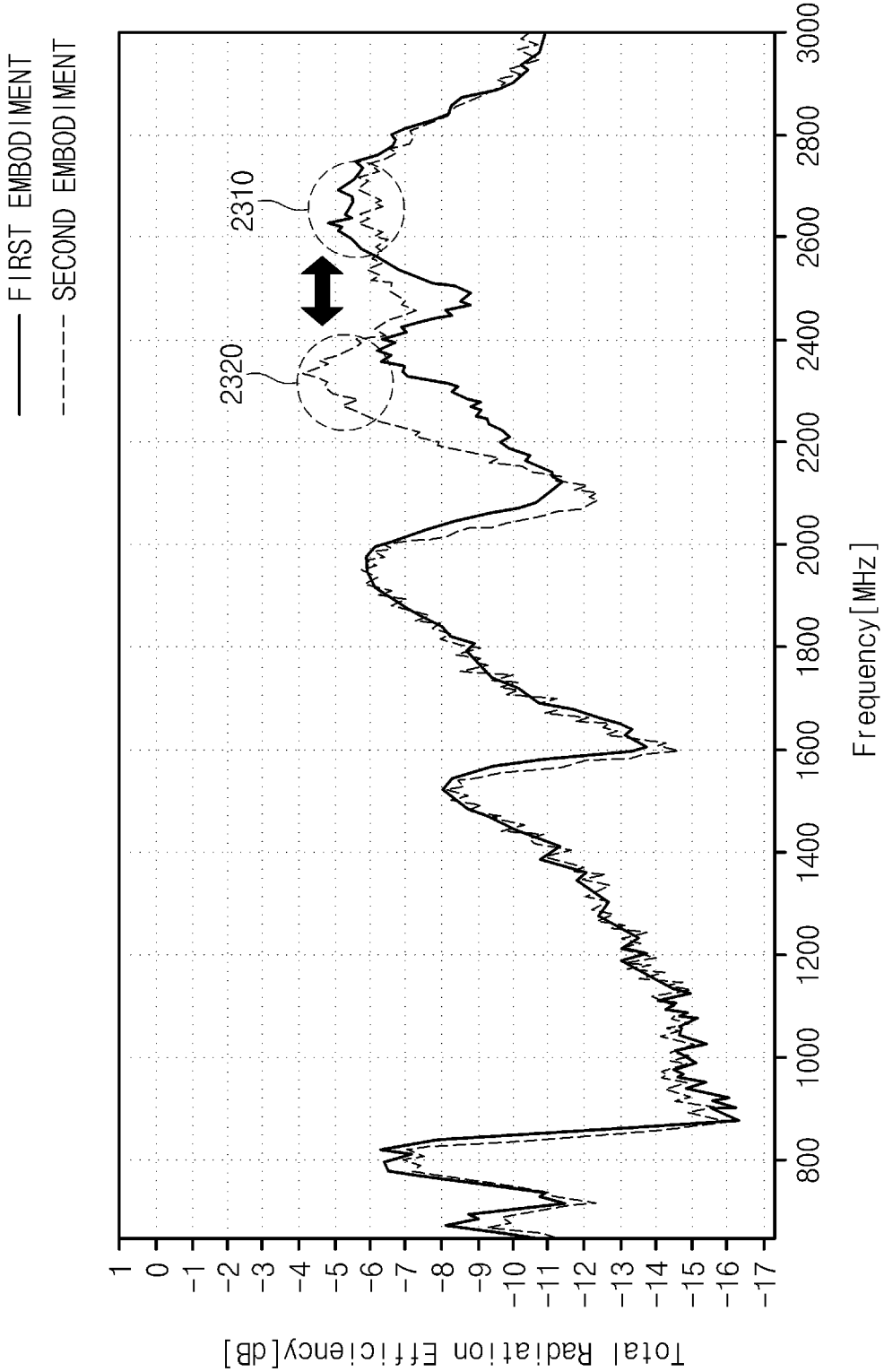
FIG. 23 is a graph depicting frequency dependent total radiation efficiency of an antenna included in an electronic device according to an embodiment.

FIG. 23 is a graph depicting frequency dependent total radiation efficiency of an antenna included in an electronic device according to an embodiment. The graph of FIG. 23 depicts total radiation efficiency of the second conductive part 512 of FIG. 22, which supports the high band (e.g., about 2.3 GHz to about 2.7 GHz).

FIG. 23 shows a graph depicting frequency dependent total radiation efficiency according to a first embodiment where the switch 2210 connects the conductive loop 511a to the first element 2220. FIG. 23 also shows another graph depicting frequency dependent total radiation efficiency according to a second embodiment where the switch 2210 connects the conductive loop 511a to the second element 2230. As illustrated in a first region 2310, in the first embodiment, total radiation efficiency of the second conductive part 512 may be increased in the frequency band of about 2600 MHz to about 2700 MHz. Meanwhile, as illustrated in a second region 2320, in the second embodiment, total radiation efficiency of the second conductive part 512 may be increased in a frequency band of about 2300 MHz to about 2400 MHz. Through FIG. 23, it can be confirmed that the resonant frequency of the second conductive part 512 changes when the element connected to the conductive loop 511a changes.

An electronic device according to an embodiment may include a housing that includes a first plate, a second plate, and a side member surrounding an inner space of the electronic device between the first plate and the second plate, a display exposed through a portion of the first plate, at least one wireless communication circuit disposed inside the housing, and a processor disposed inside the housing and electrically connected with the display and the at least one wireless communication circuit. The side member may include a first conductive part, a second conductive part, and a first non-conductive part in contact with the first conductive part and the second conductive part and interposed between the first conductive part and the second conductive part. The first conductive part may include a conductive loop disposed adjacent to the first non-conductive part and protruding toward the inner space of the electronic device. The second conductive part may include a first conductive protrusion adjacent to the third non-conductive part and protruding toward the inner space of the electronic device and a second conductive protrusion protruding toward the inner space of the electronic device. The first conductive protrusion may be disposed between the conductive loop and the second conductive protrusion. The at least one wireless communication circuit may be electrically connected with the conductive loop and the second conductive protrusion.

According to an embodiment, the first conductive protrusion and the second conductive protrusion may have substantially the same length.

According to an embodiment, the electronic device may further include a ground layer spaced apart from the side member and disposed adjacent to a partial section of the first conductive part, and the ground layer may be electrically coupled with the partial section of the first conductive part.

According to an embodiment, the first conductive part may be electrically coupled with the second conductive part.

According to an embodiment, the first conductive protrusion may protrude from one end of the second conductive part that is adjacent to the first conductive part.

According to an embodiment, the electronic device may further include a matching circuit between the second conductive protrusion and the at least one wireless communication circuit, and the matching circuit may be electrically connected with the second conductive protrusion and the at least one wireless communication circuit.

According to an embodiment, at least a portion of the first conductive part, at least a portion of the second conductive part, and the second conductive protrusion may form an electrical path to radiate or receive a signal in a specified band.

According to an embodiment, the second conductive part may further include a third conductive protrusion protruding toward the inner space of the electronic device. The third conductive protrusion may be further away from the first conductive protrusion than the second conductive protrusion. The second conductive protrusion, at least a portion of the second conductive part, and the third conductive protrusion may form an electrical path to radiate or receive a signal in a specified band.

According to an embodiment, the electronic device may further include a first element, a second element having a different impedance than the first element, and a switch configured to selectively connect the first conductive part with the first element or the second element.

According to an embodiment, the electronic device may further include a connecting member electrically connected with the second conductive protrusion, a feeding line electrically connecting the at least one wireless communication circuit with the connecting member, a conductive pad spaced apart from the connecting member and electrically coupled with the connecting member, and a ground line electrically connected with the conductive pad.

An electronic device according to an embodiment may include a housing that includes a first plate, a second plate, and a side member surrounding an inner space of the electronic device between the first plate and the second plate, a ground layer spaced apart from the side member and disposed adjacent to at least a partial section of the side member, a display exposed through a portion of the first plate, a communication circuit disposed inside the housing, and a processor disposed inside the housing and electrically connected with the display and the communication circuit. The side member may include a first conductive part, a second conductive part, and a non-conductive part in contact with the first conductive part and the second conductive part and interposed between the first conductive part and the second conductive part. The first conductive part may be electrically coupled with the second conductive part. The ground layer may be electrically coupled with a partial section of the first conductive part that is adjacent to the second conductive part. The communication circuit may be electrically connected with the first conductive part and the second conductive part.

According to an embodiment, the second conductive part may include a first conductive protrusion adjacent to the non-conductive part and protruding toward the inner space of the electronic device and a second conductive protrusion protruding toward the inner space of the electronic device. The first conductive protrusion may be disposed between the first conductive part and the second conductive protrusion. The communication circuit may be electrically connected with the second conductive protrusion of the second conductive part.

According to an embodiment, the electronic device may further include a ground line electrically connected with the second conductive part. The second conductive part may further include a third conductive protrusion protruding toward the inner space of the electronic device and electrically connected with the ground line. The third conductive protrusion may be further away from the first conductive protrusion than the second conductive protrusion.

According to an embodiment, the ground layer may be disposed to block a signal from being transmitted from the first conductive part to the second conductive part.

According to an embodiment, the ground layer may be disposed to prevent a signal transmitted from the second conductive part to the partial section of the first conductive part from being further transmitted to a remaining section of the first conductive part.

According to an embodiment, at least a portion of the first conductive part may be configured to radiate or receive a signal in a first band.

According to an embodiment, at least a portion of the second conductive part and the partial section of the first conductive part may form an electrical path to receive a signal in a second band.

According to an embodiment, the second conductive protrusion, at least a portion of the second conductive part, and the third conductive protrusion may form an electrical path to receive a signal in a third band.

According to an embodiment, the electronic device may further include a printed circuit board on which the communication circuit and the processor are disposed, and the ground layer may be embedded in the printed circuit board.

An electronic device according to an embodiment may include a housing that includes a first plate, a second plate, and a side member surrounding an inner space of the electronic device between the first plate and the second plate, a ground plate spaced apart from the side member and disposed adjacent to at least a partial section of the side member, a display exposed through a portion of the first plate, a communication circuit disposed inside the housing, and a processor disposed inside the housing and electrically connected with the display and the communication circuit. The side member may include a first conductive part, a second conductive part, a third conductive part, a first non-conductive part in contact with the first conductive part and the second conductive part and interposed between the first conductive part and the second conductive part, and a second non-conductive part in contact with the first conductive part and the third conductive part and interposed between the first conductive part and the third conductive part. The second conductive part may include a first conductive protrusion adjacent to the first non-conductive part and protruding toward the inner space of the electronic device and a second conductive protrusion protruding toward the inner space of the electronic device. The first conductive protrusion may be disposed between the first conductive part and the second conductive protrusion. The first conductive part may be electrically coupled with the second conductive part and the third conductive part. The ground plate may be electrically coupled with a partial section of the first conductive part that is adjacent to the third conductive part. The communication circuit may be electrically connected with the first conductive part, the second conductive protrusion of the second conductive part, and the third conductive part.

The term "module" used in this disclosure may include a unit composed of hardware, software and firmware and may be interchangeably used with the terms "unit," "logic," "logical block," "component," and "circuit". The "module" may be an integrated component for performing one or more functions or may perform the one of more functions in conjunction with other components. The "module" may be implemented mechanically or electronically and may include at least one of an application-specific IC (ASIC) chip, a field-programmable gate array (FPGA), and a programmable-logic device for performing some operations, which are known or will be developed. At least a part of an apparatus (e.g., modules or functions thereof) or a method (e.g., operations) according to various embodiments may be, for example, implemented by instructions stored in computer-readable storage media (e.g., the memory 130) in the form of a program module. The instruction, when executed by a processor (e.g., the processor 120), may cause the processor to perform a function corresponding to the instruction. A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and an internal memory. Also, the one or more instructions may contain code made by a compiler or code executable by an interpreter. A module or a program module according to various embodiments may include at least one of the above elements, or a part of the above elements may be omitted, or other elements may be further included. Operations performed by a module, a program module, or other elements according to various embodiments may be executed sequentially, in parallel, repeatedly, or in a heuristic method or some operations may be executed in different sequences or may be omitted. Alternatively, other operations may be added.

While the present disclosure has been shown and described with reference to various embodiments thereof, it will be understood by those skilled in the art that various changes in form and details may be made therein without departing from the spirit and scope of the present disclosure as defined by the appended claims and their equivalents.

Certain aspects of the above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

What is claimed is:

1. An electronic device comprising:
   a housing including a first plate, a second plate, and a side member surrounding an inner space of the electronic device between the first plate and the second plate;
   a display exposed through a portion of the first plate;
   at least one wireless communication circuit disposed inside the housing; and
   a processor disposed inside the housing and electrically connected with the display and the at least one wireless communication circuit, wherein the side member includes:
a first conductive part;
a second conductive part; and
a first non-conductive part in contact with the first conductive part and the second conductive part and interposed between the first conductive part and the second conductive part,
wherein the first conductive part includes a conductive loop disposed adjacent to the first non-conductive part and protruding toward the inner space of the electronic device,
wherein the second conductive part includes:
a first conductive protrusion protruding toward the inner space of the electronic device; and
a second conductive protrusion protruding toward the inner space of the electronic device,
wherein the first conductive protrusion is disposed between the conductive loop and the second conductive protrusion, and
wherein the at least one wireless communication circuit is electrically connected with the conductive loop and the second conductive protrusion.

2. The electronic device of claim 1, wherein the first conductive protrusion and the second conductive protrusion have a substantially same length.

3. The electronic device of claim 1, further comprising:
a ground layer spaced apart from the side member and disposed adjacent to a partial section of the first conductive part, the ground layer being electrically coupled with the partial section of the first conductive part.

4. The electronic device of claim 1, wherein the first conductive part is electrically coupled with the second conductive part.

5. The electronic device of claim 1, wherein the first conductive protrusion protrudes from one end of the second conductive part that is adjacent to the first conductive part.

6. The electronic device of claim 1, further comprising:
a matching circuit between the second conductive protrusion and the at least one wireless communication circuit, the matching circuit being electrically connected with the second conductive protrusion and the at least one wireless communication circuit.

7. The electronic device of claim 1, wherein at least a portion of the first conductive part, at least a portion of the second conductive part, and the second conductive protrusion form an electrical path to radiate or receive a signal in a specified band.

8. The electronic device of claim 1, wherein the second conductive part further includes a third conductive protrusion protruding toward the inner space of the electronic device,
wherein the third conductive protrusion is further away from the first conductive protrusion than the second conductive protrusion, and
wherein the second conductive protrusion, at least a portion of the second conductive part, and the third conductive protrusion form an electrical path to radiate or receive a signal in a specified band.

9. The electronic device of claim 1, further comprising:
a first element;
a second element having a different impedance than the first element; and
a switch configured to selectively connect the first conductive part with the first element or the second element.

10. The electronic device of claim 1, further comprising:
a connecting member electrically connected with the second conductive protrusion;
a feeding line electrically connecting the at least one wireless communication circuit with the connecting member;
a conductive pad spaced apart from the connecting member and electrically coupled with the connecting member; and
a ground line electrically connected with the conductive pad.

11. An electronic device comprising: a housing including a first plate, a second plate, and a side member surrounding an inner space of the electronic device between the first plate and the second plate; a ground layer spaced apart from the side member and disposed adjacent to at least a partial section of the side member; a display exposed through a portion of the first plate; a communication circuit disposed inside the housing; and a processor disposed inside the housing and electrically connected with the display and the communication circuit, wherein the side member includes a first conductive part, a second conductive part, and a non-conductive part in contact with the first conductive part and the second conductive part and interposed between the first conductive part and the second conductive part, wherein the first conductive part is electrically coupled with the second conductive part, wherein the ground layer is electrically coupled with a partial section of the first conductive part that is adjacent to the second conductive part, wherein the communication circuit is electrically connected with the first conductive part and the second conductive part, and
wherein the second conductive part includes a first conductive protrusion adjacent to the non-conductive part and protruding toward the inner space of the electronic device and a second conductive protrusion protruding toward the inner space of the electronic device, wherein the first conductive protrusion is disposed between the first conductive part and the second conductive protrusion, and wherein the communication circuit is electrically connected with the second conductive protrusion of the second conductive part.

12. The electronic device of claim 11, further comprising: a ground line electrically connected with the second conductive part, wherein the second conductive part further includes a third conductive protrusion protruding toward the inner space of the electronic device and electrically connected with the ground line, and wherein the third conductive protrusion is further away from the first conductive protrusion than the second conductive protrusion.

13. The electronic device of claim 11, wherein the ground layer is disposed to block transmission of a signal from the first conductive part to the second conductive part.

14. The electronic device of claim 11, wherein the ground layer is disposed to prevent a signal transmitted from the second conductive part to the partial section of the first conductive part from being further transmitted to a remaining section of the first conductive part.

15. The electronic device of claim 11, wherein at least a portion of the first conductive part is configured to radiate or receive a signal in a first band.

16. The electronic device of claim 11, wherein at least a portion of the second conductive part and the partial section of the first conductive part form an electrical path to receive a signal in a second band.

17. The electronic device of claim 12, wherein the second conductive protrusion, at least a portion of the second conductive part, and the third conductive protrusion form an electrical path to receive a signal in a third band.

18. The electronic device of claim 11, further comprising:
a printed circuit board on which the communication circuit and the processor are disposed,
wherein the ground layer is embedded in the printed circuit board.

19. An electronic device comprising:
a housing including a first plate, a second plate, and a side member surrounding an inner space of the electronic device between the first plate and the second plate;
a ground plate spaced apart from the side member and disposed adjacent to at least a partial section of the side member;
a display exposed through a portion of the first plate;
a communication circuit disposed inside the housing; and
a processor disposed inside the housing and electrically connected with the display and the communication circuit,
wherein the side member includes a first conductive part, a second conductive part, a third conductive part, a first non-conductive part in contact with the first conductive part and the second conductive part and interposed between the first conductive part and the second conductive part, and a second non-conductive part in contact with the first conductive part and the third conductive part and interposed between the first conductive part and the third conductive part,
wherein the second conductive part includes a first conductive protrusion adjacent to the first non-conductive part and protruding toward the inner space of the electronic device and a second conductive protrusion protruding toward the inner space of the electronic device,
wherein the first conductive protrusion is disposed between the first conductive part and the second conductive protrusion,
wherein the first conductive part is electrically coupled with the second conductive part and the third conductive part,
wherein the ground plate is electrically coupled with a partial section of the first conductive part that is adjacent to the third conductive part, and
wherein the communication circuit is electrically connected with the first conductive part, the second conductive protrusion, and the third conductive part.

* * * * *